United States Patent
Nii

(10) Patent No.: US 7,683,365 B2
(45) Date of Patent: Mar. 23, 2010

(54) IMAGE PICKUP DEVICE

(75) Inventor: Kazumi Nii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1200 days.

(21) Appl. No.: 11/213,743

(22) Filed: Aug. 30, 2005

(65) Prior Publication Data

US 2006/0044561 A1  Mar. 2, 2006

(30) Foreign Application Priority Data

Aug. 30, 2004  (JP) .......................... P.2004-249666
Mar. 9, 2005  (JP) .......................... P.2005-065395

(51) Int. Cl.
*H01L 35/24* (2006.01)
*H01L 51/00* (2006.01)

(52) U.S. Cl. ................................. 257/40; 257/E51.001
(58) Field of Classification Search .................... 257/40
See application file for complete search history.

(56) References Cited

U.S. PATENT DOCUMENTS

2004/0067387 A1* 4/2004 Kim et al. ................... 428/690
2004/0085598 A1   5/2004 Kokeguchi et al.

FOREIGN PATENT DOCUMENTS

| JP | 2001326079 A | * | 11/2001 |
| JP | 2002-502120 A | | 1/2002 |
| JP | 2003-134933 A | | 5/2003 |
| JP | 2003-158254 A | | 5/2003 |
| JP | 2003-234460 A | | 8/2003 |
| JP | 2004-134933 A | | 4/2004 |

OTHER PUBLICATIONS

Machine Translation of JP 2001-326079.*
Kock-Yee Law, Chem. Rev., 1993, vol. 93, pp. 449-486.
S.R. Forrest, J. Appl. Phys. 2003, vol. 93, pp. 3693-3723.
S. Aihara, Appl. Phys. Lett. 2003, vol. 82, pp. 511-513.
Japanese Notice of Reasons for Rejection issued in Japanese Patent Application No. 2005-065395 dated Oct. 7, 2009.

* cited by examiner

*Primary Examiner*—Kenneth A Parker
*Assistant Examiner*—Anthony Ho
(74) *Attorney, Agent, or Firm*—Sughrue Mion, PLLC

(57) ABSTRACT

An image pickup device comprises an organic photoelectric conversion film sandwiched between at least two electrodes, wherein the organic photoelectric conversion file comprises a specific quinacridone derivative or a specific quinazoline derivative.

20 Claims, 1 Drawing Sheet

IMAGE PICKUP DEVICE

This is a non-provisional application which claims priority from Japanese patent application 2004-249666 filed on Aug. 30, 2004, and from Japanese patent application 2005-065396 filed on Mar. 9, 2009, all of which are incorporated herein by reference.

BACKGROUND OF THE INVENTION

1. Field of the Invention

The present invention relates to a photoelectric conversion film having sharp spectral characteristics, a photoelectric conversion device and a solid-state image pickup device having such photoelectric conversion film and a method of applying an electric field to such devices.

2. Description of the Related Art

A photoelectric conversion film is widely utilized for example in a photosensor, and is particularly advantageously employed as a solid-state image pickup device (photosensor) of an image pickup apparatus (solid-state image pickup apparatus) such as a television camera. The photoelectric conversion film employed as a solid-state image pickup device of the image pickup apparatus is principally constituted of an inorganic material such as a Si film or an a-Si film.

Photoelectric conversion characteristics of a prior photoelectric conversion film utilizing a film of such inorganic material do not have a steep dependence on wavelength. For this reason, an image pickup apparatus utilizing such inorganic material in the photoelectric conversion film generally has a three-plate structure, including a prism for separating an incident light into three primary colors of red, green and blue, and three photoelectric conversion films positioned behind such prism.

However, the image pickup apparatus of such three-plate structure inevitably becomes large in dimension and weight, because of its structure.

In order to realize a compact and light image pickup apparatus, there is desired a single-plate structure utilizing a single photosensor device without a color-separating prism, and an image pickup apparatus of a structure having red, green and blue filters on a single-plate photosensor device is already commercialized and utilized popularly. However, because filters of red, green and blue colors and microlenses for increasing the light concentrating efficiency are laminated, such photosensor device is complex in structure and the efficiency of utilizing of light is not high. For dispensing with the filters, there can be conceived a device provided with photoelectric conversion films having spectral characteristics of red, green and blue colors, and a photoelectric conversion film utilizing an organic material is advantageous in a freedom in designing the light absorbing characteristics.

A photoelectric conversion film utilizing an organic material is represented for example by an electrophotographic photosensitive member and a solar cell, and various materials are being investigated. The material for electrophotography is described for example in Koch and Yee Law, Chemical Rev., 93, 449(1993) while the material for a solar cell is described for example in S. R. Forrest, J. Appl. Phys., 93, 3693(2003), but such materials, having a broad absorption spectrum in a film, result in a broad photoelectric conversion spectrum showing the wavelength dependence of the photoelectric conversion ability, and do not have a sharp wavelength dependence enabling a color separation into red, green and blue colors. Also S. R. Forrest, J. Appl. Phys., 93, 3693(2003) describes an insertion of a BCP intermediate layer between a photoelectric conversion layer and a metal electrode thereby improving a device efficiency, but a device utilizing BCP is insufficient in durability.

A photosensor device utilizing an organic film capable of color separation into red, green and blue colors is described, for example, JP-T No. 2002-502120, JP-A Nos. 2003-158254 and 2003-234460, and S. Aihara, Appl. Phys. Lett., 82, 511 (2003). For example the JP-A No. 2003-234460 describes, in an example, a coumarin 6/polysilane film having a photosensitivity in the entire blue region of 500 nm or less, and a rhodamine 6G/polysilane film having a photosensitivity in the green region, but both elements have an internal quantum efficiency of photoelectric conversion as low as 1%, and are also insufficient in durability. Also a device utilizing a ZnPc/Alq3 film as a photoelectric conversion film has a relatively high internal quantum efficiency of about 20%, but is insufficient in the spectral characteristics, having an absorption in the blue color region in addition to the red color region. Thus, such films are insufficient in the spectral characteristics, light-emitting characteristics and device durability for use as an image pickup device, and improvements are being desired. Also the use of quinacridone as a photoelectric conversion material is described in JP-A No. 2004-134933, but is merely mentioned as an example of organic pigments, and no description is made on the method of use capable of satisfying the spectral characteristics, light-emitting characteristics and device durability.

SUMMARY OF THE INVENTION

An object of the present invention is to provide a photoelectric conversion film, a photoelectric conversion device and an image pickup device (preferably a color image sensor) having a narrow half-peak width of absorption, also to provide a photoelectric conversion film, a photoelectric conversion device and an image pickup device having a high photoelectric conversion efficiency and an excellent durability, and to provide an image pickup device having a spectral sensitivity particularly in a green region.

The present invention is attained by following means.

(1) An image pickup device comprising an organic photoelectric conversion film sandwiched between at least two electrodes, wherein the organic photoelectric conversion film includes a quinacridone derivative represented by a general formula (I) or a quinazoline derivative represented by a general formula (II):

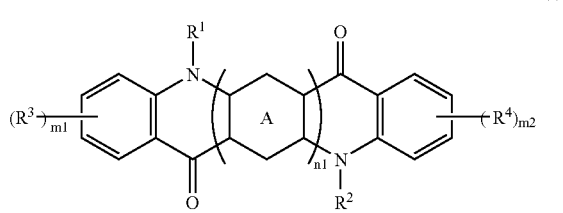

-continued

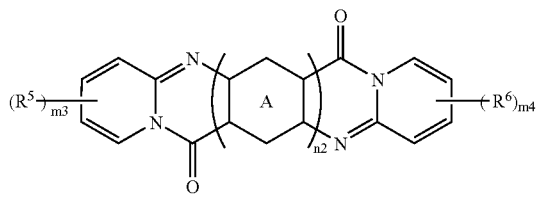
(II)

wherein a ring A represents:

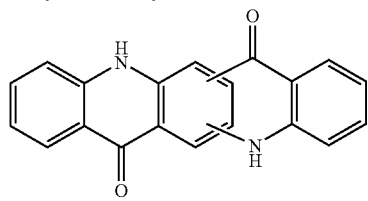

n1 and n2 each independently represents 0 or 1; a portion of the ring A having n1 or n2 of 0 represents a vinyl group, namely,

the ring A may further have a substituent; $R^1$ and $R^2$ each independently represents a hydrogen atom, an alkyl group, an aryl group or a heterocyclic group; $R^3$, $R^4$, $R^5$ and $R^6$ each independently represents a substituent; m1, m2, m3 and m4 each independently represents an integer of 0 to 4, and, in case m1, m2, m3 or m4 represents an integer of 2 to 4, plural $R^3$s, $R^4$s, $R^5$s or $R^6$s may be mutually bonded to form a ring.

(2) An image pickup device comprising a positive hole transport material containing a quinacridone derivative or a quinazoline derivative described in (1), and an electron transport material having a peak wavelength of an absorption spectrum, equal to or shorter than a peak wavelength of an absorption spectrum of the positive hole transport material.

(3) An image pickup device described in (2), wherein the electron transport material is selected from: a 5- to 7-membered heterocyclic compound comprising a nitrogen atom, an oxygen atom or a sulfur atom (that may be further condensed with another ring); an aromatic condensed carbon ring compound; and a metal complex compound having a nitrogen-containing heterocyclic compound as a ligand.

(4) An image pickup device described in (2) or (3), wherein a film of the electron transport material has a crystalline state.

(5) An image pickup device described in any one of (1) to (4), wherein, in an absorption spectrum of the organic photoelectric conversion film, an absorption peak at a longest wavelength has a half-peak width of 50 to 150 nm.

(6) An image pickup device described in any one of (1) to (5), further comprising at least one charge transport layer for transporting electrons generated in the organic photoelectric conversion film, wherein a longer wavelength end of an absorption spectrum of said at least one charge transport layer is positioned at a shorter wavelength than a longer wavelength end of an absorption spectrum of Alq (aluminum quinoline).

(7) An image pickup device described in (6), wherein the absorption spectrum of the charge transport layer has a longer wavelength end positioned at 400 nm or shorter.

(8) An image pickup device described in (6) or (7), further comprising a layer having a filter effect for absorbing light of a wavelength of 400 nm or less, and realizing a structure in which the charge transport layer does not absorb light by the filter effect of the layer.

(9) An image pickup device described in any one of (1) to (8), wherein the absorption spectrum of the organic photoelectric conversion film has a peak at a wavelength of 510 to 570 nm.

(10) An image pickup device described in any one of (6) to (9), wherein a material constituting the charge transport layer is a compound represented by a general formula (III):

$$L-(A)_m \qquad (III)$$

wherein A represents a heterocycle formed by condensing two or more aromatic heterocycles, in which heterocycles represented by A may be mutually same or different; m represents an integer of 2 or larger; and L represents a connecting group.

(11) An image pickup device described in (10), wherein a material constituting the charge transport layer is a compound represented by a general formula (VI):

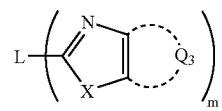
(VI)

wherein X represents O, S, Se, Te or N—R; R represents a hydrogen atom, an aliphatic hydrocarbon group, an aryl group or a heterocyclic group; $Q_3$ represents an atomic group required for forming a nitrogen-containing aromatic heterocyclic group; m represents an integer of 2 or larger; and L represents a connecting group.

(12) A method for applying an electric field, and a device subjected to an electric field application, wherein an electric field of 10 V/m to $1 \times 10^{12}$ V/m is applied to a photoelectric conversion film, a photoelectric conversion device or an image pickup device according to any one of (1) to (11).

(13) A device comprising at least two electromagnetic wave-absorbing/photoelectric converting portions, of which at least one comprises an image pickup device described in any one of (1) to (11).

(14) A device described in (13), wherein said at least two electromagnetic wave-absorbing/photoelectric converting portions have a laminate structure of at least two layers.

(15) A device described in (14), wherein an upper layer comprises a portion capable of a photoelectric conversion by absorbing green light.

(16) A device comprising at least three electromagnetic wave-absorbing/photoelectric converting portions, of which at least one comprises an image pickup device described in any one of (1) to (11).

(17) A device described in (16), wherein said at least three electromagnetic wave-absorbing/photoelectric converting portions have a laminate structure of at least three layers, and an upper layer of said at least three layers comprises a portion capable of a photoelectric conversion by absorbing green light.

(18) A device described in (16) or (17), wherein at least two of said at least three electromagnetic wave-absorbing/photoelectric converting portions are formed by inorganic layers.

(19) A device described in (17) or (18), wherein at least two of said at least three electromagnetic wave-absorbing/photoelectric converting portions are formed in a silicon substrate.

Figure 1:
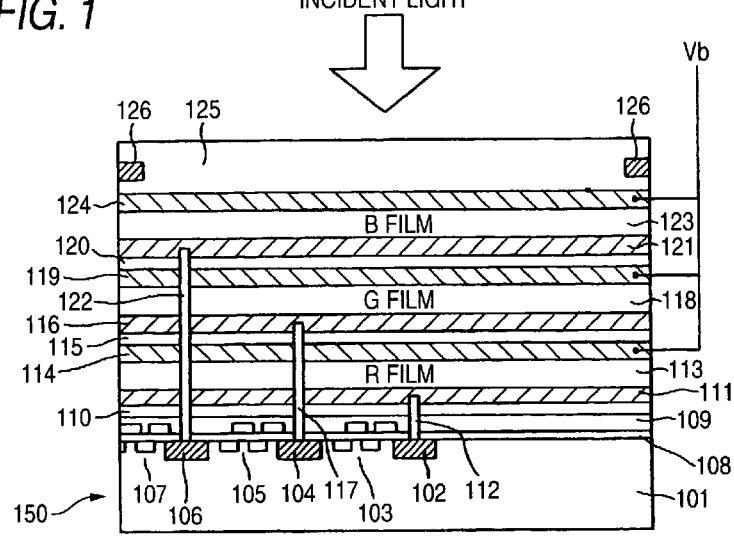
FIG. 1 is a schematic cross-sectional view of a pixel of a photoelectric conversion laminate image pickup device having 3-layered BGR laminate structure of the invention.

1 denotes an antireflection film; 2 denotes an infrared intercepting dielectric multi-layered film; 3, 4, 5 denote protective films; 6 denotes a transparent counter electrode; 7 denotes an electron blocking layer; 8 denotes a p-layer; 9 denotes n-layer; 10 denotes a positive hole blocking layer; 11, 12 denote layer containing metal wirings; 13 denotes a silicon single crystal substrate; 14 denotes a transparent pixel electrode; 15 denotes a plug; 16 denotes a pad; 17 denotes a light shielding film; 18 denotes a connecting electrode; 19 denotes a metal wiring; 20 denotes a counter electrode pad; 21 denotes an n-layer; 22 denotes a p-layer; 23 denotes a n-layer; 24 denotes a p-layer; 25 denotes an n-layer; 26 denotes a transistor; 27 denotes a signal readout pad; 101 denotes a p-well layer; 102, 104, 106 denote high concentration impurity areas; 103, 105, 107 denote MOS circuits; 108 denotes a gate insulation film; 109, 110 denote insulation films; 111, 114, 116, 119, 121, 124 denote transparent electrode films; 112, 117, 122 denote electrodes; 113, 118, 123 denote photoelectric conversion films; 110, 115, 120, 125 denote transparent insulation films; and 126 denotes a light shielding film; 150 denotes a semiconductor substrate.

DETAILED DESCRIPTION OF THE INVENTION

The present invention relates to an image pickup device characterized in that an organic photoelectric conversion film sandwiched between at least two electrodes a positive hole transport material containing a quinacridone derivative represented by the aforementioned general formula (I) or a quinazoline derivative represented by the aforementioned general formula (IT) (quinacridone derivative or quinazoline derivative absorbs light and also functions as a positive hole transport material), and an electron transport material having a peak wavelength of an absorption spectrum, equal to or shorter than a peak wavelength of an absorption spectrum of the positive hole transport material.

A substituent represented by $R^3$, $R^4$, $R^5$ or $R^6$ in the general formulas (I) and (II) can be, for example, an alkyl group (preferably with 1-30 carbon atoms, more preferably 1-20 carbon atoms and particularly preferably 1-10 carbon atoms, such as methyl, ethyl, iso-propyl, tert-butyl, n-octyl, n-decyl, n-hexadecyl, cyclopropyl, cyclopentyl or cyclohexyl), an alkenyl group (preferably with 2-30 carbon atoms, more preferably 2-20 carbon atoms and particularly preferably 2-10 carbon atoms, such as vinyl, allyl, 2-butenyl or 3-pentenyl), an alkinyl group (preferably with 2-30 carbon atoms, more preferably 2-20 carbon atoms and particularly preferably 2-10 carbon atoms, such as propargyl or 3-pentinyl), an aryl group (preferably with 6-30 carbon atoms, more preferably 6-20 carbon atoms and particularly preferably 6-12 carbon atoms, such as phenyl, p-methylphenyl, naphthyl or anthranyl), an amino group (amino group substitutable with an alkyl group, an aryl group or a heterocyclic group, preferably with 0-30 carbon atoms, more preferably 0-20 carbon atoms and particularly preferably 0-10 carbon atoms, such as amino, methylamino, dimethylamino, diethylamino, dibenzylamino, diphenylamino or ditolylamino), an alkoxy group (preferably with 1-30 carbon atoms, more preferably 1-20 carbon atoms and particularly preferably 1-10 carbon atoms, such as methoxy, ethoxy, butoxy or 2-ethylhexyloxy), an aryloxy group (preferably with 6-30 carbon atoms, more preferably 6-20 carbon atoms and particularly preferably 6-12 carbon atoms, such as phenyloxy, 1-naphthyloxy, or 2-naphthyloxy), a heteroaryloxy group (preferably with 1-30 carbon atoms, more preferably 1-20 carbon atoms and particularly preferably 1-12 carbon atoms, such as pyridyloxy, pyradyloxy, pyrimidyloxy or quinolyloxy), an acyl group (preferably with 1-30 carbon atoms, more preferably 1-20 carbon atoms and particularly preferably 1-12 carbon atoms, such as acetyl, benzoyl formyl or pivaloyl), an alkoxycarbonyl group (preferably with 2-30 carbon atoms, more preferably 2-20 carbon atoms and particularly preferably 2-12 carbon atoms, such as methoxycarbonyl or ethoxycarbonyl), an aryloxycarbonyl group (preferably with 7-30 carbon atoms, more preferably 7-20 carbon atoms and particularly preferably 7-12 carbon atoms, such as phenyloxycarbonyl), an acyloxy group (preferably with 2-30 carbon atoms, more preferably 2-20 carbon atoms and particularly preferably 2-10 carbon atoms, such as acetoxy or benzoyloxy), a cylamino group (preferably 2-30 carbon atoms, more preferably 2-20 carbon atoms, and particularly preferably 2-10 carbon atoms, such as acetylamino or benzoylamino), an alkoxycarbonylamino group (preferably with 2-30 carbon atoms, more preferably 2-20 carbon atoms and particularly preferably 2-12 carbon atoms, such as methoxylcarbonylamino), aryloxycarbonylamino (preferably 7-30 carbon atoms, more preferably 7-20 carbon atoms, and particularly 7-12, such as phenyloxycarbonyamino),a sulfonylamino group (preferably with 1-30 carbon atoms, more preferably 1-20 carbon atoms and particularly preferably 1-12 carbon atoms, such as methanesulfonylamino or benzenesulfonylamino), a sulfamoyl group (preferably with 0-30 carbon atoms, more preferably 0-20 carbon atoms and particularly preferably 0-12 carbon atoms, such as sulfamoyl, methylsulfamoyl, dimethylsulfamoyl or phenylsulfamoyl), a carbamoyl group (preferably with 1-30 carbon atoms, more preferably 1-20 carbon atoms and particularly preferably 1-12 carbon atoms, such as carbamoyl, methyl carbamoyl, diethylcarbamoyl or phenylcarbamoyl), an alkylthio group (preferably with 1-30 carbon atoms, more preferably 1-20 carbon atoms and particularly preferably 1-12 carbon atoms, such as methylthio or ethylthio), an arylthio group (preferably with 6-30 carbon atoms, more preferably 6-20 carbon atoms and particularly preferably 6-12 carbon atoms, such as phenylthio), a heterocycle-substituted thio group (preferably with 1-30 carbon atoms, more preferably 1-20 carbon atoms and particularly preferably 1-12 carbon atoms, such as pyridylthio, 2-benzimizolylthio, 2-benzoxazolylthio or 2-benzothiazolylthio), a sulfonyl group (preferably with 1-30 carbon atoms, more preferably 1-20 carbon atoms and particularly preferably 1-12 carbon atoms, such as mesyl or tosyl), a sulfinyl group (preferably with 1-30 carbon atoms, more preferably 1-20 carbon atoms and particularly preferably 1-12 carbon atoms, such as methanesulfinyl or benzenesulfinyl), an ureido group (preferably with 1-30 carbon atoms, more preferably 1-20 carbon atoms and particularly preferably 1-12 carbon atoms, such as ureido, methylureido or phenylureido), a phosphoric acid amide group (preferably with 1-30 carbon atoms, more preferably 1-20 carbon atoms and particularly preferably 1-12 carbon atoms, such as diethylphosphoric acid amide or phenylphosphoric acid amide), a hydroxyl group, a mercapto group, a halogen atom (such as a fluorine atom, a chlorine atom, a bromine atom or an iodine atom), a cyano group, a sulfo group, a carboxyl group, a nitro group, a hydroxamic acid group, a sulfino group, a hydrazino group, an imino group, a heterocyclic group (preferably with 1-30 carbon atoms and more preferably 1-12 carbon atoms, including a hetero, atom such as a nitrogen atom, an oxygen atom, or a sulfur atom, such as imidazolyl, pyridyl, quinolyl, furyl, thienyl, piperidyl, morpholino, benzoxazolyl, benzimidazolyl, benzothiazolyl, carbazolyl or azepinyl), or a silyl group (preferably with 3-40 carbon atoms, more preferably 3-30 carbon atoms and particularly preferably 3-24 carbon atoms, such as trimethylsilyl or triphenylsilyl). Such substituent may be further substituted.

A substituent represented by $R^1$ or $R^2$ is an alkyl group, an aryl group or a heterocyclic group, more preferably an alkyl group, an aryl group or a heterocyclic group explained by the examples of the substituent represented by $R^3$, $R^4$, $R^5$ or $R^6$. $R^1$ and $R^2$ each is preferably a hydrogen atom, an alkyl group or an aryl group, more preferably a hydrogen atom or an alkyl group, and particularly preferably a hydrogen atom or an alkyl group with 1-5 carbon atoms.

A ring A is preferably a benzene ring, and n1 and n2 each is preferably 1. A substituent represented by $R^3$, $R^4$, $R^5$ or $R^6$ is a halogen atom, an alkyl group, an alkoxy group, an aryl group or a heterocyclic group, more preferably a halogen atom, an alkyl group, an alkoxy group, an aryl group or a heterocyclic group, explained by the aforementioned examples of the substituent represented by $R^3$, $R^4$, $R^5$ or $R^6$, and each of $R^3$, $R^4$, $R^5$ and $R^6$ is preferably a halogen atom, an alkyl group or an alkoxy group, more preferably a halogen atom or an alkyl group, and particularly preferably an alkyl group. Each of m1, m2, m3 and m4 is preferably 0 or 1.

Within the compounds represented by the general formula (I) and the general formula (II), those represented by the general formula (I) are employed more preferably, in the invention.

In the following, there will be shown examples of the compounds represented by the general formula (I) and the general formula (II), but the present invention is not limited to such examples.

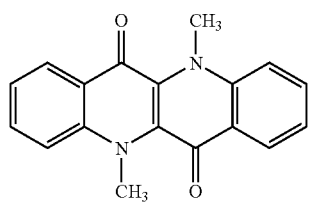
(S-1)

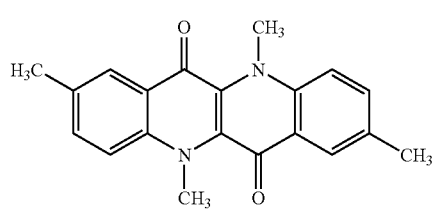
(S-2)

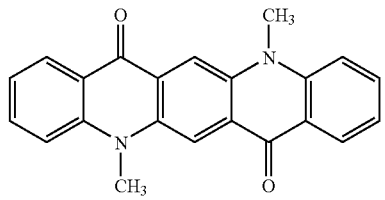
(S-3)

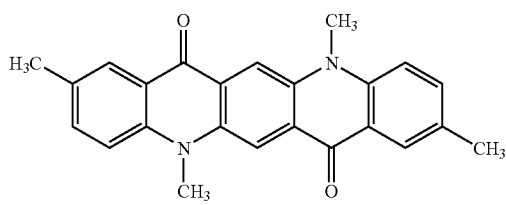
(S-4)

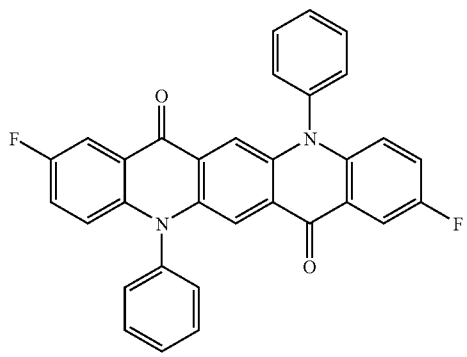
(S-5)

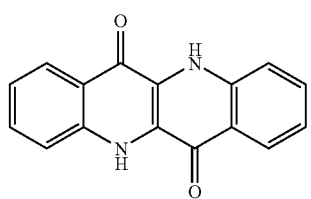
(S-6)

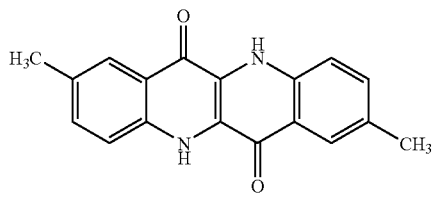
(S-7)

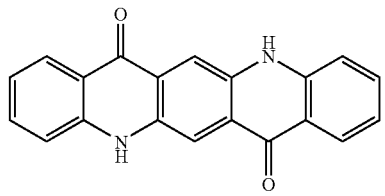
(S-8)

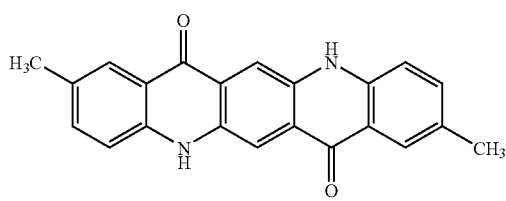
(S-9)

-continued
(S-10)
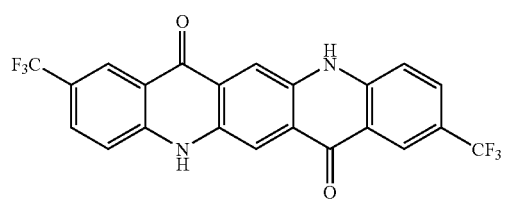
(S-11)
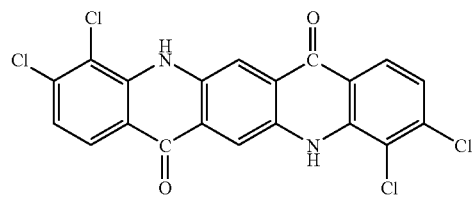
(S-12)
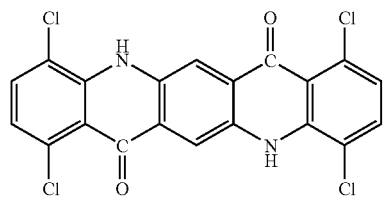
(S-13)
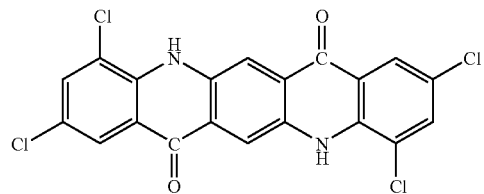
(S-14)
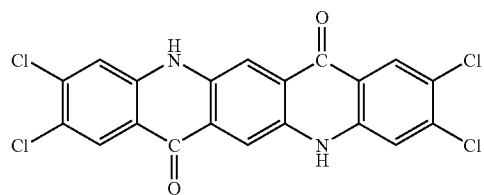
(S-15)
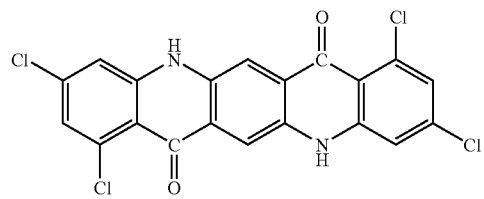
(S-16)
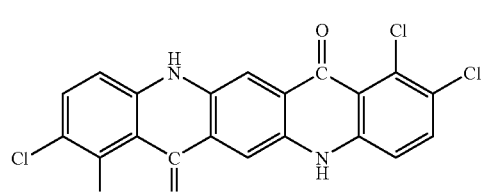
-continued
(S-17)
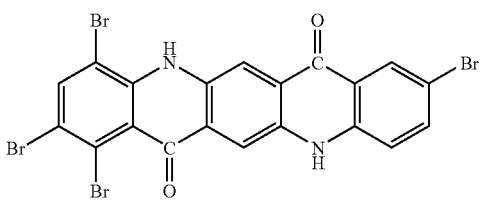
(S-18)
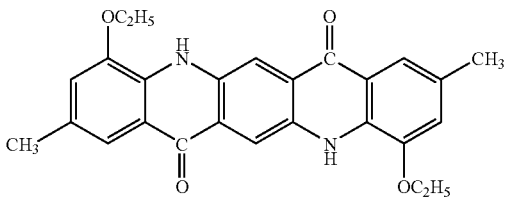
(S-19)
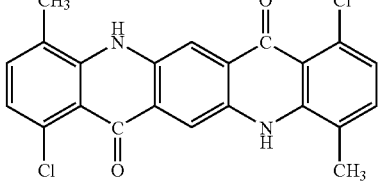
(S-20)
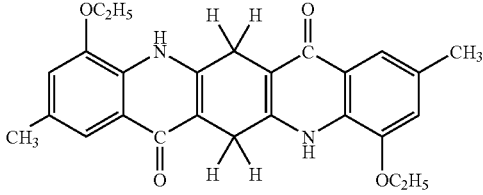
(S-21)
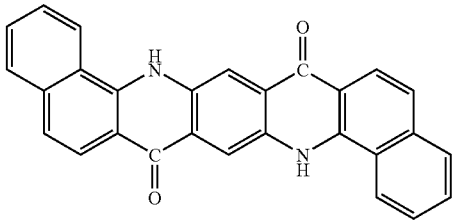
(S-22)
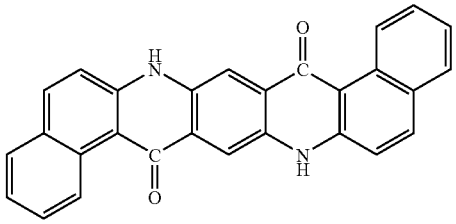
(S-23)

-continued (S-24)
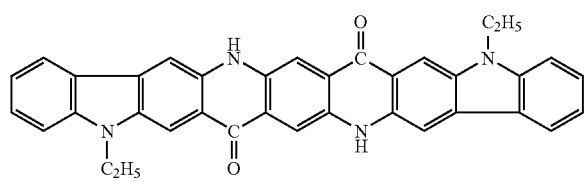

(S-25)
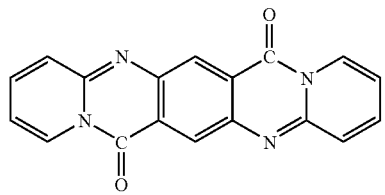

(S-26)
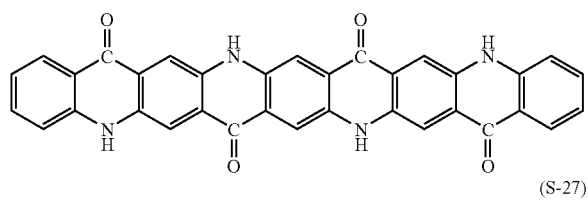

(S-27)
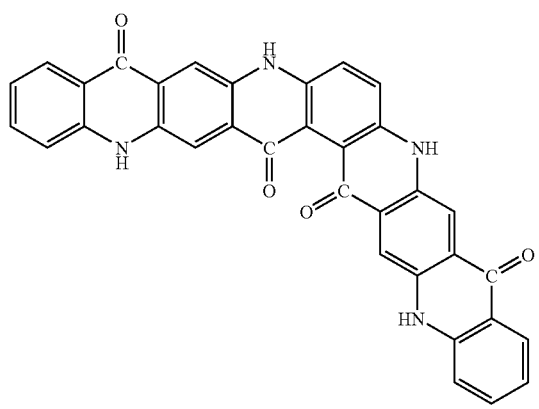

The photoelectric conversion film of the invention may further include an organic p-type compound or an organic n-type compound to be explained in the following.

The organic p-type semiconductor (compound) is a donor type organic semiconductor (compound), means an organic compound having an electron donating property and is represented principally by a positive hole transporting organic compound. More specifically, it means aniorganic compound having a smaller ionization potential when two organic materials are employed in mutual contact. Therefore, any organic compound having an electron donating property may be employed as the donor type organic compound, such as a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, an aromatic condensed carbon ring compound (a naphthalene derivative, an anthracene derivative, a phenanthrene derivative, a tetracene derivative, a pyrene derivative, a perylene derivative or a fluoranthene derivative), or a metal complex having a nitrogen-containing heterocyclic compound as a ligand. These examples are not restrictive, and, as explained above, any organic compound, having a smaller ionization potential than in an organic compound used as an n-type (acceptor) compound, may be employed as a donor organic semiconductor.

The organic n-type semiconductor (compound) is an acceptor type organic semiconductor (compound), means an organic compound having an electron accepting property and is represented principally by an electron transporting organic compound. More specifically, it means an organic compound having a larger electron affinity when two organic Materials are employed in mutual contact. Therefore, any organic compound having an electron accepting property may be employed as the acceptor type organic compound, such as an aromatic condensed carbon ring compound (such as a naphthalene derivative, an anthracene derivative, a phenanthrene derivative, a tetracene derivative, a pyrene derivative, a perylene derivative, or a fluoranthene derivative), a 5- to 7-membered heterocyclic compound containing a nitrogen atom, an oxygen atom or a sulfur atom (such as pyridine, pyradine, pyrimidine, pyridazine, triazine, quinoline, quinoxaline, quinazoline, phthalazine, cinnoline, isoquinoline, puteridine, acrydine, phenadine, phenanthroline, tetrazole, pyrazol, imidazole, thiazole, oxazole, indazole, benzimidazole, benzotriazole, benzoxazol, benzothiazole, carbazole, purine, triazoropyridazine, triazoropyrimidine, tetrazaindene, oxadiazole, imidazopyridine, pyralidine, pyrrolopyridine, thiadiazolopyridine, dibenzazepine, or tribenzazepine), a polyarylene compound, a fluorene compound, a cyclopentadiene compound, a silyl compound, or a metal complex having a nitrogen-containing heterocyclic compound as a ligand. These examples are not restrictive, and, as explained above, any organic compound, having a higher electron affinity than in an organic compound used as a donor compound, may be employed as an acceptor organic semiconductor.

Any p-type organic dye or any n-type organic dye may be utilized, but preferred examples include a cyanine dye, a styryl dye, a hemicyanine dye, a merocyanine dye (including zero-methine merocyanine (simple merocyanine)), a 3-nuclei merocyanine dye, a 4-nuclei merocyanine dye, a rhodacyanine dye, a complex cyanine dye, a complex merocyanine dye, an aropolar dye, an oxonol dye, a hemioxonol dye, a squarilium dye, a chroconium dye, an azamethine dye, a coumarine dye, an arylidene dye, an anthraquinone dye, a triphenylmethane dye, an azo dye, an azomethine dye, a spiro compound, a metallocene dye, a fluorenone dye, a fulgide dye, a perylene dye, a phenazine dye, a phenothiazine dye, a quinone dye, an indigo dye, a diphenylmethane dye, a polyene dye, an acridine dye, an acrydinone dye, a diphenylamine dye, a quinacridone dye, a quinophthalone dye, a phenoxadine dye, a phthaloperylene dye, a dichetopyrrolopyrole dye, a dioxane dye, a porphiline dye, a chlorophil dye, a phthalocyanine dye, a metal complex dye, and an aromatic condensed carbon ring dye (such as a naphthalene derivative, an anthracene derivative, a phenanthrene derivative, a tetracene derivative, a pyrene derivative, a perylene derivative, or a fluoranthene derivative).

A film formed by the p-type organic dye or the n-type organic dye may be amorphous or crystalline, but is preferably crystalline in case of forming a photoelectric conversion film. For forming a film having a crystalline state there is employed for example a pigment having a crystallizing property among the aforementioned p-type organic dyes and the n-type organic dyes.

A layer containing such organic compound is formed by a dry film forming method or a wet film forming method.

Specific examples of the dry film forming method include a gaseous physical film growing method such as vacuum evaporation, ion plating or MBE, and a CVD method such as plasma polymerization, and those of the wet film forming method include a casting method, a spin coating method, a dipping method and an LB method.

In case of employing a polymer compound as at least one of the p-type semiconductor (compound) and the n-type semiconductor (compound), a wet film forming method that enables an easy film formation is preferably used for film formation. In a dry film forming method such as evaporation, a polymer is difficult to use because of possible decomposition, and an oligomer can be advantageously employed instead. In case of employing a low molecular material, a film is preferably formed with a dry film forming method such as co-evaporation.

In the following there will be explained an electron transporting material employed in the device of the invention. The electron transporting material employed in the invention can be those explained in the organic n-type semiconductor (compound), and is preferably a 5- to 7-membered heterocyclic compound containing a nitrogen atom, an oxygen atgm or a sulfur atom (that may be further condensed with another ring), an aromatic condensed carbon ring compound and a metal complex compound having a nitrogen-containing heterocyclic compound as a ligand, more preferably a metal complex compound having a nitrogen-containing heterocyclic compound as a ligand or a 5- to 7-membered heterocyclic compound containing a nitrogen atom, an oxygen atom or a sulfur atom (that may be further condensed with another ring), further preferably a compound represented by the general formula (III) and particularly preferably a compound represented by the general formula (VI).

At first a compound represented by the general formula (III) will be explained. A represents a heterocycle formed by condensing two or more aromatic heterocycles, in which heterocycles represented by A may be mutually same or different. The heterocyclic group represented by A is preferably formed by a condensation of 5- or 6-membered aromatic heterocycles, more preferably by a condensation of 2 to 6 aromatic heterocycles, further preferably 2 to 3 aromatic heterocycles, and particularly preferably 2 aromatic heterocycles. A hetero atom in such case is preferably N, O, S, Se or Te atom, more preferably N, O or S atom and further preferably an N atom. Specific examples of the aromatic heterocycle constituting the heterocyclic group represented by A include furan, thiophene, pyran, pyrrole, imidazole, pyrazole, pyridine, pyradine, pyrimidine, pyridazine, thiazole, oxazole, isothiazole, isooxazole, thiadiazole, oxadiazole, triazole, selenazole, and tellurazole, preferably imidazole, pyrazole, pyridine, pyradine, pyrimidine, pyridazine, thiazole and oxazole, and more preferably imidazole, thiazole, oxazole, pyridine, pyradine, pyrimidine and pyridazine.

Specific examples of the condensed rings represented by A include indolizine, purine, pteridine, carboline, pyrroloimidazole, pyrrolotriazole, pyrazoloimidazole, pyrazolotriazole, pyrazolopyrimidine, pyrazolotriazine, triazolopyridine, tetrazaindene, pyrroloimidazole, pyrrolotriazole, imidazoimidazole, imidazopyridine, imidazopyradine, imidazopyrimidine, imidazopyridazine, oxazolopyridine, oxazolopyradine, oxazolopyrimidine, oxazolopyridazine, thiazolopyridine, thiazolopyradine, thiazolopyrimidine, thiazolopyridazine, pyridinopyradine, pyradinopyradine, pyradinopyridazine, naphthylidine and imidazotriazine, preferably imidazopyridine, imidazopyradine, imidazopyrimidine, imidazopyridazine, oxazolopyridine, oxazolopyradine, oxazolopyrimidine, oxazolopyridazine, thiazolopyridine, thiazolopyradine, thiazolopyrimidine, thiazolopyridazine, pyridinopyradine, and pyradinopyradine, further preferably imidazopyridine, oxazolopyridine, thiazolopyridine, pyridinopyradine, and pyradinopyradine, and particularly preferably imidazopyridine.

The heterocyclic group represented by A may be further condensed with another ring, or may have a substituent.

A substituent of the heterocyclic group represented by A can preferably be an alkyl group, an alkenyl group, an alkinyl group, an aryl group, an amino group, an alkoxy group, an aryloxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a sulfonyl group, a halogen atom, a cyano group or a heterocyclic group, more preferably an alkyl group, an alkenyl group, an aryl group, an alkoxy group, an aryloxy group, a halogen atom, a cyano group or a heterocyclic group, further preferably an alkyl group, an aryl group, an alkoxy group, an aryloxy group or an aromatic heterocyclic group, and particularly preferably an alkyl group, an aryl group, an alkoxy group or an aromatic heterocyclic group. m represents an integer of 2 or larger, preferably 2 to 8, more preferably 2 to 6, further preferably 2 to 4, particularly preferably 2 or 3, and most preferably 3.

L represents a connecting group. The connecting group represented by L is a connecting group formed for example by a single bond, C, N, O, S, Si or Ge, more preferably a single bond, alkylene, alkenylene, alkinylene, arylene, a divalent heterocycle (preferably an aromatic heterocycle and more preferably an aromatic heterocycle formed by azole, thiophene or furan ring), or a group formed from N and any of such groups, and further preferably arylene, a divalent heterocycle or a group formed from N and any of such groups. The connecting group represented by L may have a substituent, for which usable are substituents for the heterocyclic group represented by A to be explained later.

Specific examples of the connecting group represented by L, include a single bond and those described in Japanese Patent Application No. 2004-082002, paragraphs 0037-0040.

The compound represented by the general formula (III) can be more preferably represented by a general formula (VI).

In the general formula (VI), m and L respectively have same meanings as those in the general formula (III), and have same preferable ranges. X represents O, S, Se, Te or N—R. R represents a hydrogen atom, an aliphatic hydrocarbon group, an aryl group or a heterocyclic group. $Q_3$ represents an atomic group required for forming an aromatic heterocycle.

The aliphatic hydrocarbon group represented by R is preferably an alkyl group (preferably with 1-20 carbon atoms, more preferably 1-12 carbon atoms and particularly preferably 1-8 carbon atoms, such as methyl, ethyl, iso-propyl, tert-butyl, n-octyl, n-decyl, n-hexadecyl, cyclopropyl, cyclopentyl or cyclohexyl), an alkenyl group (preferably with 2-20 carbon atoms, more preferably 2-12 carbon atoms and particularly preferably 2-8 carbon atoms, such as vinyl, allyl, 2-butenyl or 3-pentenyl), anvalkinyl group (preferably with 2-20 carbon atoms, more preferably 2-12 carbon atoms and particularly preferably 2-8 carbon atoms, such as propargyl or 3-pentinyl), and more preferably an alkyl group or an alkenyl group.

An aryl group represented by R preferably has 6-30 carbon atoms, more preferably 6-20 carbon atoms and particularly preferably 6-12 carbon atoms, such as phenyl, 2-methylphenyl, 3-methylphenyl, 4-methylphenyl, 4-methoxyphenyl, 3-trifluoromethyl, pentafluorophenyl, 2-biphenylyl, 3-biphenylyl, 4-biphenylyl, 1-naphthyl, 2-naphthyl or 1-pyrenyl.

A heterocyclic group represented by R is a single-ring or condensed-ring heterocyclic group (preferably 1-20 carbon atoms, more preferably 1-12 carbon atoms and further preferably 2-10 carbon atoms), and is preferably an aromatic heterocyclic group containing at least one of a nitrogen atom, an oxygen atom, a sulfur atom and a selenium atom. Specific examples of the heterocyclic group represented by R include pyrrolidine, piperidine, pyrrole, furan, thiophene, imidazoline, imidazole, benzimidazole, naphthoimidazole, thiazolidine, thiazole, benzothiazole, naphthothiazole, isothiazole, oxazoline, oxazole, benzoxazole, naphthooxazole, isooxazole, selenazole, benzoselenazole, naphthoselenazole, pyridine, quinoline, isoquinoline, indole, indolenine, pyrazole, pyradine, pyrimidine, pyridazine, triazine, indazole, purine, phthalazine, naphthylidine, quinoxaline, quinazoline, cinnoline, pteridine, phenanthridine, pteridine, phenanthroline, and tetrazaindene, preferably furan, thiophene, pyridine, quinoline, pyradine, pyrimidine, pyridazine, triazine, phthalazine, naphthylidine, quinoxaline, or quinatoline, more preferably furan, thiophene, pyridine or quinoline, and particularly preferably quinoline.

The aliphatic hydrocarbon group, the aryl group or the heterocyclic group represented by R may have a substituent, for which applicable are substituents for the heterocyclic group represented by A in the general formula (III) and which has a same preferable range. R is preferably an alkyl group, an aryl group or an aromatic heterocyclic group, more preferably an aryl group, or an aromatic heterocyclic group, and further preferably an aryl group or an aromatic azole group.

X is preferably O, S, or N—R, more preferably O or N—R, further preferably N—R, and particularly preferably N—Ar (Ar being an aryl group or an aromatic azole group, more preferably an aryl group with 6-30 carbon atoms or an aromatic azole group with 2-30 carbon atoms, further preferably an aryl group with 6-20 carbon atoms or an aromatic azole group with 2-16 carbon atoms, and particularly preferably an aryl group with 6-12 carbon atoms or an aromatic azole group with 2-10 carbon atoms).

$Q_3$ represents an atomic group necessary for forming an -aromatic heterocycle. An aromatic heterocycle formed by $Q_3$ is preferably a 5- or 6-membered aromatic heterocycle, more preferably a 5- or 6-membered nitrogen-containing aromatic heterocycle, and further preferably a 6-membered nitrogen-containing aromatic heterocycle. Specific examples of the aromatic heterocycle formed by $Q_3$ include furan, thiophene, pyran, pyrrole, imidazole, pyrazole, pyridine, pyradine, pyrimidine, pyridazine, thiazole, oxazole, isothiazole, isooxazole, thiadiazole, oxadiazole, triazole, selenazole and tellurazole, preferably pyridine, pyradine, pyrimidine, and pyridazine, more preferably pyridine or pyradine and further preferably pyridine. The aromatic heterocycle formed by $Q_3$ may form a condensed ring with another ring, or may have a substituent. Such substituent can be similar to those of the heterocyclic group represented by A in the general formula (I), and has a similar preferable range.

In the following there are shown specific examples of the compound represented by the general formula (XII) of the invention (including the compound represented by the general formula (VI)), but the invention is not limited to such examples, and other examples include compounds 1-20 described in Japanese Patent Application No. 2004-082002, paragraphs 0086-0090 and compounds 27-118 described in paragraphs 0093-0121.

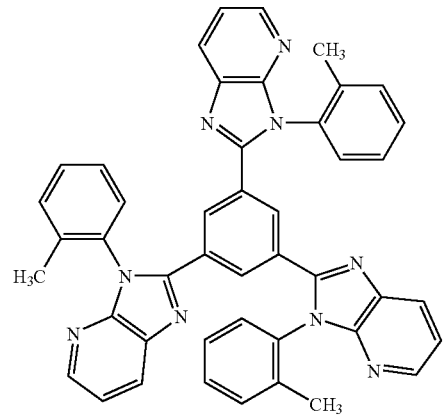

21

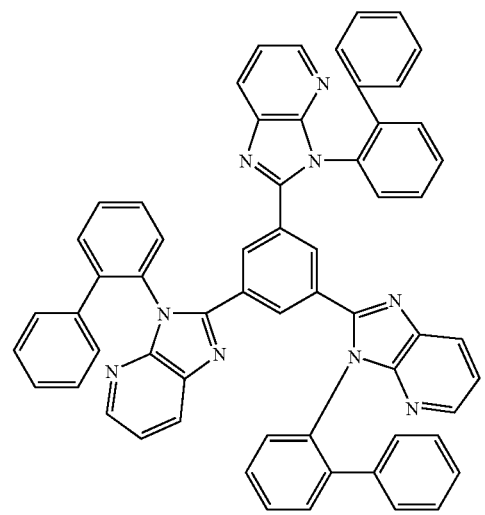

22

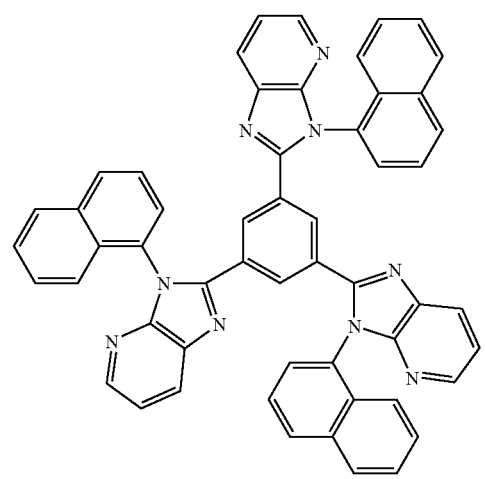

23

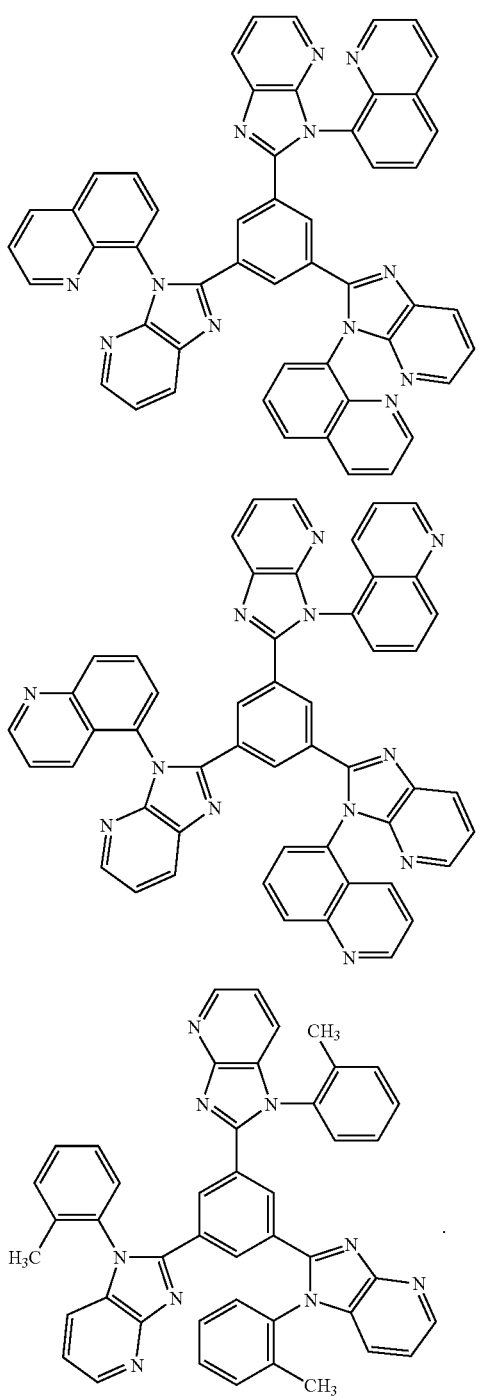

Details of the electron transporting material described in the general formula (III) and a preferred range thereof are described in Japanese Patent Application No. 2004-082002.

In the following there will be explained a metal complex compound.

The metal complex compound is a metal complex having a ligand, containing at least a nitrogen atom, an oxygen atom or a sulfur atom, coordinated to a metal, and a metal atom in the metal complex is not particularly restricted, but is preferably a beryllium ion, a magnesium ion, an aluminum ion, a gallium ion, a zinc ion, an indium ion or a tin ion, more preferably a beryllium ion, an aluminum ion, a gallium ion, or a zinc ion, and further preferably an aluminum ion or a zinc ion.

As a ligand in the metal complex, there can be utilized various known ligands such as those described in H. Yersin, "Photochemistry and Photophysics of Coordination Compounds", Springer Verlag (1987), and Akio Yamamoto, "Organometallic Chemistry, Basics and Applications", Shokabo Co. (1982).

The ligand is preferably a nitrogen-containing heterocyclic ligand (preferably with 1-30 carbon atoms, more preferably 2-20 carbon atoms and. particularly preferably 3-15 carbon atoms; that can be a monodentate ligand or a bi- or polydentate ligand, preferably a bidentate ligand; such as a pyridyl ligand, a bipyridyl ligand, a quinolinol ligand, a hydroxyphenylazole ligand (such as a hydroxyphenylbenzimidazole ligand, a hydroxyphenylbenzoxazole ligand, or a hydroxyphenylimidazole ligand)), an alkoxy ligand (preferably with 1-30 carbon atoms, more preferably 1-20 carbon atoms and particularly preferably 1-10 carbon atoms; such as methoxy, vethoxy, butoxy or 2-ethylhexyloxy), an aryloxy ligand (preferably with 6-30 carbon atoms, more preferably 6-20 carbon atoms and particularly preferably 6-12 carbon atoms; such as phenyloxy, 1-naphthyloxy, 2-naphthyloxy, 2,4,6-trimethylphenyloxy or 4-biphenyloxy), a heteroaryloxy ligand (preferably with 1-30 carbon atoms, more preferably 1-20 carbon atoms and particularly preferably 1-12 carbon atoms; such as pyridyloxy, pyradyloxy, pyrimidyloxy or quinolyloxy), an alkylthio ligand (preferably with 1-30 carbon atoms, more preferably 1-20 carbon atoms and particularly preferably 1-12 carbon atoms; such as *methylthio or ethylthio), an arylthio ligand (preferably with 6-30 carbon atoms, more preferably 6-20 carbon atoms and particularly preferably 6-12 carbon atoms; such as phenylthio), a heterocycle-substituted thio ligand (preferably with 1-30 carbon atoms, more preferably 1-20 carbon atoms and particularly preferably 1-12 carbon atoms; such as pyridylthio, 2-benziinidazolylthio, 2-benoxazolylthio or 2-benzthiazolylthio), or a siloxy ligang (preferably with 1-30 carbon atoms, more preferably 3-25 carbon atoms and particularly preferably 6-20 carbon atoms; such as a triphenylsiloxy group, a triethoxysiloxy group or a triisopropylsiloxy group), more preferably a nitrogen-containing heterocyclic ligand, an aryloxy ligand, a heteroaryloxy ligand or a siloxy ligand, and further preferably a nitrogen-containing heterocyclic ligand, an aryloxy ligand, or a siloxy ligand.

The metal complex to be employed in the image pickup device of the invention is preferably a compound represented by a general formula (IV) or a general formula (V) or a tautomer thereof, and is more preferably a compound represented by the general formula (IV) or a tautomer thereof.

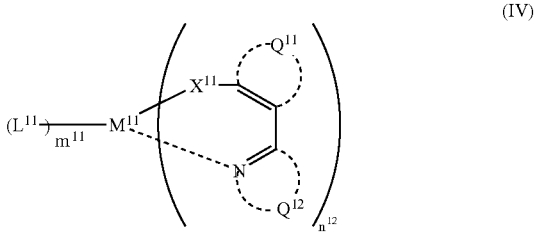

(IV)

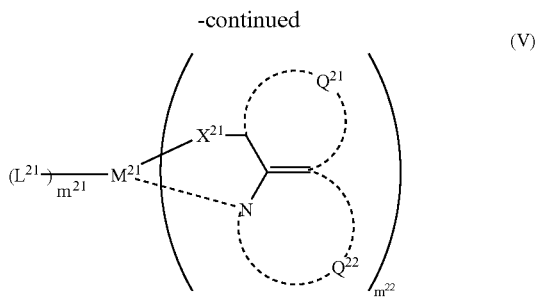

(V)

In the general formula (IV), $M^{11}$ represents a metal ion and $L^{11}$ represents a ligand. $X^{11}$ represents an oxygen atom, a substituted or non-substituted nitrogen atom (a substituent on nitrogen atom can be $—SO_2R^a$, $—COR^b$, or $—P(=O)(R^c)(R^d)$ ($R^a$, $R^b$, $R^c$ and $R^d$ each representing an aliphatic hydrocarbon group, an aryl group, a heterocyclic group, an amino group, an alkoxy group, an aryloxy group or a heterocyclic oxy group)), or a sulfur atom. $Q^{11}$ and $Q^{12}$ each represents an atomic group constituting an aromatic ring or an atomic group constituting a nitrogen-containing aromatic ring, and $Q^{11}$ and $Q^{12}$ may be combined to form a condensed ring structure. A ring formed by $Q^{11}$ or $Q^{12}$ may have a szubstituent. $m^{11}$ and $m^{12}$ respectively represent an integer of 0-3 and an integer of 1-4.

In the general formula (V), $M^{21}$ represents a metal ion. $L^{21}$ and $X^{21}$ respectively have same meanings as $L^{11}$ and $X^{11}$, and $m^{21}$ and $m^{22}$ respectively represent an integer of 0-3 and an integer of 1-4. $Q^{21}$ and $Q^{22}$ each represents an atomic group constituting an aromatic ring or an atomic group constituting a nitrogen-containing aromatic ring, and $Q^{21}$ and $Q^{22}$ may be combined to form a condensed ring structure. A ring formed by $Q^{21}$ or $Q^{22}$ may have a substituent.

The compounds represented by the general formulas (IV) and (V) have same meanings as compounds represented by general formulas (9) and (10) described in JP-A No. 2002-338957 and tautomers thereof, and have same specific examples and same synthesizing methods, and the description of the aforementioned patent literature is applicable. The metal complex to be employed in the invention particularly preferably has a short wavelength end of a film absorption spectrum, shorter than that of Alq (aluminum quinoline).

Such electron transport material is preferably employed in forming a charge transport layer, and, in such case, a longer wavelength end of an absorption spectrum of the charge transport layer is preferably at a shorter wavelength than a longer wavelength end of an absorption spectrum of the photoelectric conversion film, more preferably shorter by 50 nm or more, further preferably shorter by 100 nm or more and particularly preferably shorter by 150 nm or more.

Furthermore, an absorption spectrum of the charge transport layer preferably has a longer wavelength end at 400 nm or less, more preferably at 390 nm or less and particularly preferably at 380 nm or less.

In the photoelectric conversion film of the invention, the organic material having an electron transporting property (n-type compound) preferably has an ionization potential larger than 6.0 eV.

It is found that such organic material having an electron transporting property significantly improves the photoelectric conversion efficiency and also improves the durability.

From the standpoint of durability, it is preferred that the device structure includes a layer having a filter effect for absorbing a light of a wavelength of 400 nm or less whereby the charge transport layer does not absorb light, and more preferably that the absorption spectrum of the charge transport layer has a longer wavelength end positioned at a shorter wavelength than a shorter wavelength end of a spectrum of the light irradiating the device.

[Definition for Wavelength Dependence of Absorption of Photoelectric Conversion Film]

It is also preferable that a film absorption spectrum of the organic photoelectric conversion film at 400 nm or longer selectively corresponding to a green light region and a maximum film absorption intensity in such region is 3 times or more of a maximum film absorption intensity outside such region, more preferably 5 times or more and particularly preferably 10 times or more. Also the absorption spectrum has a peak wavelength within a range of 500 to 600 nm, more preferably 520 to 580 nm and particularly preferably 530 to 570 nm.

[Definition of Spectral Sensitivity]

Also a photoelectric conversion spectrum, indicating a spectral sensitivity, preferably has a peak wavelength within a range of 510 to 570 nm, and more preferably 520 to 560 nm. The device of the invention, satisfying these requirements, allows to realize a photoelectric conversion device of satisfactory color reproducibility utilizing BGR photoelectric conversion films, namely laminated 3 layers of a blue region photoelectric conversion film, a green region photoelectric conversion film and a red region photoelectric conversion film, thereby attaining a satisfactory color reproducibility.

[Definition of Ip and Ea]

It is also found that, in a photoelectric conversion film of a BGR separable photoelectric conversion device, an efficiency can be improved by an ionization potential (Ip) and an electron affinity (Ea) meeting following conditions:

$Ip_1 < Ip_2$, and $Ea_1 < Ea_2$ wherein $Ip_1$ and $Ea_1$ are an ionization potential and an electron affinity of the positive hole-transporting photoelectric conversion film, respectively, and Ip2 and $Ea_2$ are an ionization potential and an electron affinity of the electron-transporting photoelectric conversion film, respectively.

[Film Forming Method for Charge Transport Layer]

The charge transport layer is formed by a dry film forming method or a wet film forming method. Specific examples of the dry film forming method include a gaseous physical film growing method such as vacuum evaporation, ion plating or MBE, and a CVD method such as plasma polymerization, and those of the wet film forming method include a casting method, a spin coating method, a dipping method and an LB method. The charge transport layer is preferably formed by a dry film forming method, particularly preferably vacuum evaporation.

[Electrode]

An anode, defined as an electrode for taking out positive holes from a positive hole transporting photoelectric conversion film or a positive hole transport layer, can be prepared with a metal, an alloy, a metal oxide, an electroconductive compound or a mixture thereof, preferably with a material having a work function of 4 eV or larger. Specific examples include a conductive metal oxide such as tin oxide, zinc oxide, indium oxide, or indium tin oxide (ITO); a metal such as gold, silver, chromium or nickel; a mixture or a laminate of such metal and conductive metal oxide; an inorganic conductive substance such as copper iodide or copper sulfide; an organic conductive material such as polyaniline, polythiophene or polypyrrole; and a silicon compound and a laminate thereof with ITO, preferably a conductive metal oxide, and particularly preferably ITO in consideration of a productivity, a high conductivity and a transparency. A thickness of the anode can be suitably selected according to the material, preferably within a range of 10 nm to 5 μm, more preferably 50 nm to 1 μm, and further preferably 100 to 500 nm.

The anode is usually formed as a layer on a soda lime glass, an alkali-free glass or a transparent resinous substrate. In case of employing a glass, an alkali-free glass is preferred in order to reduce ions dissolved out from the glass. In case of employing a soda lime glass, a barrier coat such as of silica is preferably provided. A thickness of the substrate is not particularly restricted as long as a sufficient mechanical strength can be obtained, but, in case of a glass, it is usually 0.2 mm or larger and preferably 0.7 mm or larger. The anode can be prepared in various methods depending on the material, and, for example in case of ITO, a film is prepared for example by an electron beam method, a sputtering method, a resistance-heated evaporation method, a chemical reaction (sol-gel) method, or a coating method of a dispersion of indium tin oxide. The anode may be subjected to a treatment such as washing to reduce a driving voltage of the device thereby increasing the light emitting efficiency. In case of ITO, an UV-ozone treatment or a plasma treatment is effective.

A cathode, serving for taking out electrons from an electron transporting photoelectric conversion layer or an electron transport layer, is selected in consideration of an adhesion to an adjacent layer such as an electron transporting photoelectric conversion layer or an electron transport layer, an electron affinity, an ionization potential, and a stability. The cathode can be formed by a metal, an alloy, a metal halide, a metal oxide, an electroconductive compound, ITO, IZO or a mixture thereof, and specific examples include an alkali metal (such as Li, Na or K), a fluoride or an oxide thereof, an alkali earth metal (such as Mg or Ca), a fluoride or an oxide thereof, gold, silver, lead, aluminum, a sodium-potassium alloy or a mixture thereof, a lithium-aluminum alloy or a mixture thereof, a magnesium-silver alloy or a mixture thereof, a rare earth metal such as indium or ytterbium, preferably a material having a work function of 4 eV or less, and more preferably aluminum silver, gold and a mixed metal thereof. The cathode may assume not only a single-layered structure of the compound or the mixture mentioned above but also a laminated structure including the compound or the mixture mentioned above, such as a laminar structure of aluminum/lithium fluoride or aluminum/lithium oxide. A film thickness of the cathode can be selected suitably according to the material, but is usually preferred within a range of 10 nm to 5 μm, more preferably 50 nm to 1 μm, and further preferably 100 nm to 1 μm.

The cathode is prepared for example by an electron beam method, a sputtering method, a resistance-heated evaporation method or a coating method, and an evaporation may be utilized for a single metal or simultaneously for two or more components. Also an alloy electrode may be prepared by simultaneously evaporating plural metals or by evaporating an alloy prepared in advance. The anode and the cathode preferably has a low sheet resistance, preferably several hundred Ω/sq. or less.

[General Requirements]

In the present invention, there is employed an photoelectric conversion device employing preferably two or more laminated photoelectric conversion films, more preferably three or four laminated photoelectric conversion films, and particularly preferably three laminated photoelectric conversion films.

In the present invention, such photoelectric conversion device can be particularly preferably employed as an image pickup device.

In the present invention, there is preferred, a case where a voltage is applied to the photoelectric conversion film, the photoelectric conversion device or the image pickup device.

The photoelectric conversion device of the invention is preferably of a configuration having, between a pair of electrodes, a photoelectric conversion film in which a p-type semiconductor layer and an n-type semiconductor layer forms a laminate structure, more preferably a configuration where at least either of the p-type semiconductor layer and the n-type semiconductor layer includes an organic compound and further preferably a configuration where each of the p-type semiconductor layer and the n-type semiconductor layer includes an organic compound.

[Voltage Application]

A voltage application to the photoelectric conversion film of the invention is preferable in improving the photoelectric conversion efficiency. There may be applied any voltage, but a necessary voltage varies depending on the thickness of the photoelectric conversion film. More specifically, the photoelectric conversion efficiency becomes larger with an increase in the electric field applied to the photoelectric conversion film, but the applied electric field becomes larger, even at a same applied voltage, for a smaller thickness of the photoelectric conversion film. Therefore, in case the photoelectric conversion film has a small thickness, the applied voltage may be made relatively smaller. An electric field applied to the photoelectric conversion film is preferably 10 V/m or larger, more preferably $1\times10^3$ V/m or larger, further preferably $1\times10^5$ V/m or larger, particularly preferably $1\times10^6$ V/r or larger, and particularly preferably $1\times10^7$ V/m or larger. There is no particular upper limit, but, as an excessive electric field results in an undesirable current even in a dark place, the electric field is preferably $1\times10^{12}$ V/m or less, and more preferably $1\times10^9$ V/m or less.

[Bulk Hetero Junction Structure]

In the invention, a preferred configuration includes, between a pair of electrodes, a p-type semiconductor layer and an n-type semiconductor layer, of which at least either is an organic semiconductor, and also includes, between such semiconductor layers, a photoelectric conversion film (photosensitive layer) having a bulk hetero junction layer containing the p-type semiconductor and the n-type semiconductor as an intermediate layer. In such case, the presence of a bulk hetero junction structure in the organic layer in the photoelectric conversion film compensates a short carrier diffusion length in the organic layer, thereby improving the photoelectric conversion efficiency.

The bulk hetero junction structure is described in detail in Japanese Patent Application No. 2004-080639.

[Tandem Structure]

In the present invention, a preferred configuration includes, between a pair of electrodes, a photoelectric conversion film (photosensitive layer) having two or more repeating structures (tandem structures) each having a pn junction formed by a p-type semiconductor layer and an n-type semiconductor layer, and more preferably includes a thin layer of an electroconductive material between the repeating structures. A number of the pn junction repeating structures (tandem structures) may be arbitrarily selected, but, for improving the photoelectric conversion efficiency, is preferably 2-50, more preferably 2-30 and particularly preferably 2-10. The conductive material is preferably silver or gold, and most preferably silver.

In the invention, the semiconductors constituting the tandem structure may be formed by inorganic materials but are preferably constituted or organic semiconductors and more preferably organic dyes.

The tandem structure is described in detail in Japanese Patent Application No. 2004-079930.

[Definition of Alignment]

In the invention, in the image pickup device having, between a pair of electrodes, a photoelectric conversion film including a p-type semiconductor layer, an n-type semiconductor layer and (preferably mixed/dispersed (bulk hetero junction structure) layer), a preferred configuration utilizes a photoelectric conversion film containing an organic compound subjected to an alignment control in at least either of the p-type semiconductor and the n-type semiconductor, and a more preferred configuration utilizes an organic compound subjected to (or capable of) an alignment control in each of the p-type semiconductor and the n-type semiconductor.

An organic compound to be employed in the organic layer of the photoelectric conversion layer preferably have conjugate π-electrons, and a plane of such π-electrons is preferably aligned not perpendicularly to the, substrate (electrode substrate) but in a direction as close as possible thereto. An angle to the substrate is preferably 0° to 80°, more preferably 0° to 60°, further preferably 0° to 40°, further preferably 0° to 20°, particularly preferably 0° to 10°, and most preferably 0° (namely parallel to the substrate).

The layer of the organic compound with controlled alignment may be contained at least in a part of the entire organic layer, but the part with the controlled alignment preferably represents 10% or more in the entire organic layer, more preferably 30% or more, further preferably 50% or more, further preferably 70% or more, particularly preferably 90% or higher and most preferably 100%.

In such state of the photoelectric conversion film, the controlled alignment of the organic compound of the organic layer compensates a drawback of a short carrier diffusion length of the organic layer, thereby improving the photoelectric conversion efficiency.

In the controlled alignment state of the organic compound of the invention, it is further preferred that the hetero junction plane (for example a pn junction plane) is not parallel to the substrate. It is further preferred that the hetero junction plane is not parallel to the substrate (electrode substrate) but is aligned with an angle closer to a perpendicular state. An angle to the substrate is preferably within a range of 10° to 90°, more preferably 30° to 90°, further preferably 50° to 90°, further preferably 70° to 90°, particularly preferably 80° to 90°, and most preferably 90° (namely perpendicular to the substrate).

The aforementioned layer of the organic compound with a controlled hetero junction plane may be contained even in a part of the entire organic layer. A proportion of the part with the controlled alignment to the entire organic layer is preferably 10% or more, more preferably 30% or more, further preferably 50% or more, further preferably 70% or more, particularly preferably 90% or more and most preferably 100%. In such configuration, an area of the hetero junction plane increases in the organic layer to increase an amount of carriers such as electrons, positive holes or electron-hole pairs generated at the interface, thereby enabling to improve the photoelectric conversion efficiency.

An improvement in the photoelectric conversion efficiency is particularly possible in a photoelectric conversion film in which both the hetero junction plane and the π-electron plane of the organic compound are controlled in the alignments.

Such states are described in detail in Japanese Patent Application No. 2004-079931.

[Definition of Thickness of Organic Dye Layer]

In case of employing the photoelectric conversion film of the invention in a color image pickup device (image sensor), an optical absorption of the organic dye layer in each of B, G and R layers is preferably maintain at 50% or higher, more preferably 70% or higher, particularly preferably 90% (absorbance=1) or higher and most preferably 99% or higher, in order to improve the photoelectric conversion efficiency and not to pass an unnecessary light to a lower layer thereby improving the color separation. Therefore, a film thickness of the organic dye layer is preferably made larger for the optical absorption, but, in consideration of a proportion not contributing to a separation of the charge, a film thickness of the organic dye layer in the invention is preferably within a range of 30 to 300 nm, more preferably 50 to 150 nm, and particularly preferably 80 to 130 nm.

[Spectral BGR Separation]

In the invention, there is advantageously employed a photoelectric conversion device provided with BGR photoelectric conversion films of a satisfactory color reproducibility, namely three laminated layers of a blue light photoelectric conversion film, a green light photoelectric conversion film, and a red light photoelectric conversion film.

Each photoelectric conversion film preferably has a spectral absorption and/or spectral photosensitive characteristics mentioned above.

[Laminate Structure]

In the present invention, there is preferably employed a photoelectric conversion device in which at least two photoelectric conversion films are laminated. The laminate photoelectric conversion device is not particularly restricted in structure and any structure employed in this field may be employed, but a BGR 3-layer laminate structure is preferable, and a preferred example of the EGR laminate structure is shown in FIG. 1.

A solid-state image pickup device of the invention is equipped with a photoelectric conversion film as shown in the present embodiment. In the solid-state image pickup device as shown in FIG. 1, the laminated photoelectric conversion films are provided on a scanning circuit portion. The scanning circuit portion may suitably adopt a structure containing a MOS transistor for each pixel unit on a semiconductor substrate, or a structure having a CCD as an image pickup device.

For example in a solid-state image pickup device utilizing MOS transistors, an incident light transmitted by an electrode generates a charge in the photoelectric conversion film, and such charge travels in the photoelectric conversion film to an electrode by an electric field, generated between the electrodes by an voltage application of the electrodes, further travels to a charge accumulating part of the MOS transistor and is accumulated therein. The charge accumulated in the charge accumulating part moves to a charge readout part by a switching operation of the MOS transistor, and is outputted as an electrical signal. In this manner full-color image signals are supplied to a solid-state image pickup apparatus including a signal processing part.

Figure 2:
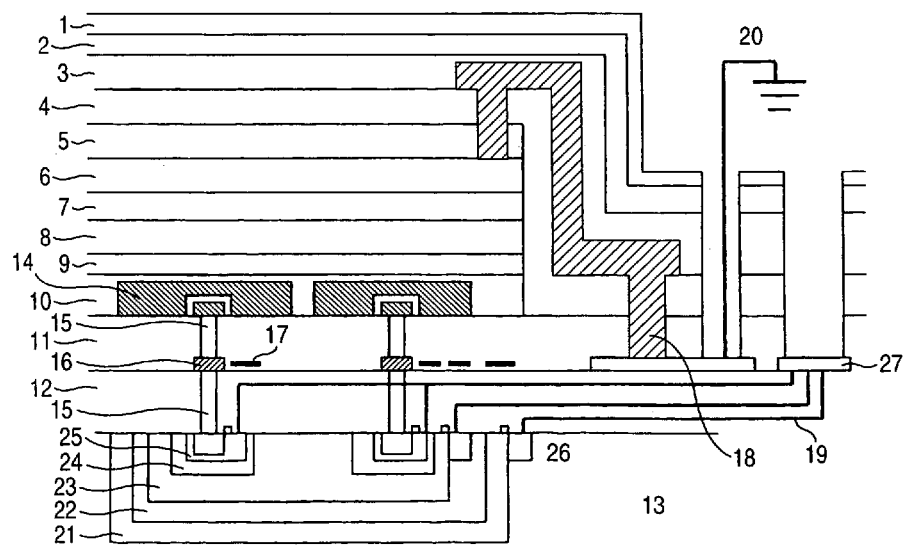
FIG. 2 is a schematic cross-sectional view of a preferred image pickup device of the invention.

For such laminate image pickup device, there can also be utilized color solid-state image pickup devices represented in JP-A No. 58-103165, FIG. 2 and JP-A No. 58-103166, FIG. 2.

For producing the laminate image pickup device, preferably the 3-layer laminate image pickup device, there can be utilized a process described in JP-A No. 2002-83946 (cf. FIGS. 7-23 and paragraphs 0026-0038).

Also the device of the present invention includes a first light-receiving portion for detecting a light of a first wavelength region, a second light-receiving portion for detecting a light of a second wavelength region, and a third light-receiving portion for detecting a light of a third wavelength region, wherein the first light-receiving portion is an organic photoelectric conversion film which is formed by a positive hole transport material constituted of a quinacridone derivative represented by the general formula (I) or a quinazoline derivative represented by the general formula (II), and an electron transport material having a peak wavelength of an absorption spectrum, equal to or shorter than a peak wavelength of an absorption spectrum of the positive hole transport material, and the second and third light-receiving portions may be those formed in a silicon substrate.

(Photoelectric Conversion Device)

In the following, there will be explained an image pickup device of a preferred embodiment.

The image pickup device of the invention is constituted of an electromagnetic wave absorption/photoelectric conversion part and a charge accumulation/transfer/readout part for the charge generated by the photoelectric conversion.

In the invention, the electromagnetic wave absorption/photoelectric conversion part has a laminate structure of at least two layers, capable of respectively absorbing and photoelectrically converting a blue light, a green light and a red light. A blue light absorbing layer (B) is capable of absorbing the light of a wavelength region at least of 400-500 nm, and preferably has an absorption rate of 50% or higher at a peak wavelength in such wavelength region. A green light absorbing layer (G) is capable of absorbing the light of a wavelength region at least of 500-600 nm, and preferably has an absorption rate of 50% or higher at a peak wavelength in such wavelength region. A red light absorbing layer (R) is capable of absorbing the light of a wavelength region at least of 600-700 nm, and preferably has an absorption rate of 50% or higher at a peak wavelength in such wavelength region. These layers may be arranged in any order, and, in case of a 3-layered laminate structure, orders of BGR, BRG, GBR, GRB, RBG and RGB are possible from above. Preferably the uppermost layer is a G layer. In case of a 2-layered laminate structure, in case an upper is an R layer, a BG layer is formed in a plane as a lower layer, also in case an upper is a B layer, a GR layer is formed in a plane as a lower layer, and in case an upper is a G layer, a BR layer is formed in a plane as a lower layer. There is preferred a case with an upper G layer and a lower BR layer in a plane. In case of forming such two light absorbing layers in a same plane of the lower layer, a filter layer capable of color separation, for example in a mosaic pattern, is preferably provided on the upper layer or between the upper and lower layers. In certain case, a fourth layer or further additional layers may be provided as a new layer or in a same plane.

In the invention, the charge accumulation/transfer/readout part is provided under the electromagnetic wave absorption/photoelectric conversion part. It is preferable that an electromagnetic wave absorption/photoelectric conversion part in an underlying layer functions also as a charge accumulation/transfer/readout part.

In the invention, the electromagnetic wave absorption/photoelectric conversion part is formed by an organic layer, an inorganic layer, or a mixture of an organic layer and an inorganic layer. The B/G/R layers may be formed by the organic layers or by the inorganic layers, preferably by a mixture of organic and inorganic layers. In such case, when an organic layer is provided, there are basically provided one or two inorganic layers, and, when two organic layers are provided, there is provided an inorganic layer. In case of employing an organic layer and an inorganic layer, the inorganic layer constitutes the electromagnetic wave absorption/photoelectric conversion part of two or more colors in a same plane. A preferred configuration is formed by an upper organic G layer and lower inorganic layers of B and R from above. In certain case, a fourth layer or further additional layers may be provided as a new layer or in a same plane. In case B/G/R layers are formed by organic layers, the charge accumulation/transfer/readout part is provided thereunder. In case the electromagnetic wave absorption/photoelectric conversion part is constituted of an inorganic layer, such inorganic layer serves also as the charge accumulation/transfer/readout part.

In the aforementioned devices of the invention, a particularly preferred embodiment of the device is as follows.

Such device includes at least two electromagnetic wave absorption/photoelectric conversion parts, of which at least one is a device (image pickup device) of the invention.

In such device, at least two electromagnetic wave absorption/photoelectric conversion parts preferably have an at least 2-layered laminate structure. Also such device preferably has an upper layer capable of absorbing and photoelectrically converting a green light.

Particularly preferably, such device includes at least three electromagnetic wave absorption/photoelectric conversion parts, of which at least one is a device (image pickup device) of the invention.

Also such device more preferably has an upper layer capable of absorbing and photoelectrically converting a green light. Also there is preferred a configuration in which at least two electromagnetic wave absorption/photoelectric conversion parts among three are formed by inorganic layers (preferably formed in a silicon substrate).

(Preferred Image Pickup Device of Invention)

A preferred image pickup device of invention will be explained with reference to FIG. 2. A silicon single crystal substrate 13 serves as an electromagnetic wave absorption/photoelectric conversion part for B and R lights and a charge accumulation/transfer/readout part for the charge generated by the photoelectric conversion. A p-type silicon substrate is usually employed for this purpose. An n-layer 21, a p-layer 22 and an n-layer 23 are formed in the silicon substrate. The n-layer 21 constitutes an accumulating part for a signal charge of the R light, and accumulates a signal charge obtained by the photoelectric conversion of the R light in the pn junction. The accumulated charge is transferred, through a transistor 26, by a metal wiring 19 to a signal readout pad 27. The n-layer 23 constitutes an accumulating part for a signal charge of the B light, and accumulates a signal charge obtained the photoelectric conversion of the R light in the pn junction. The accumulated charge is transferred, through a transistor similar to 26, by a metal wiring 19 to a signal readout pad 27. The p-layer, the n-layer, the transistor and the metal wiring are illustrated schematically, but are suitably selected in optimum structures as detailedly described in the foregoing. As the B light and the R light are separated by a depth in the silicon substrate, selection of a depth of the pn junction or the like in the silicon substrate and a dope concentration are important. A layer 12 including a metal wiring includes silicon oxide or silicon nitride as a principal component. A thickness of the layer 12 is preferably smaller, and is 5 μm or less, preferably 3 μm or less and further preferably 2 μm or less. Layer 11 also includes silicon oxide or silicon nitride as a principal component. The layers 11 and 12 are provided with plugs 15, for transferring the signal charge of the G light to the silicon substrate, and such plugs are connected by a pad 16 provided between the layers 11 and 12. The plug is preferably constituted principally of tungsten, and the pad is preferably constituted principally of aluminum. The plug is preferably provided with the barrier layer including the above-mentioned metal wiring. The signal charge of the G light transferred through the plug 15 is accumulated in an n-layer 25 in the silicon substrate. The n-layer 25 is separated by a p-layer 24. The accumulated charge is guided, through a transistor similar to 26, by a metal wiring 19 to a signal readout pad 27. Since a photoelectric conversion by a pn junction between the layers 24 and 25 produces a noise, a light shielding film 17 is provided in the layer 11. The light shielding film is usually constituted principally of tungsten, or aluminum. A thickness of the layer 12 is preferably smaller, and is 3 µm or less, preferably 2 µm or less and further preferably 1 µm or less. The signal readout pad 27 is preferably provided for each of B, G and R signals. These structures can be prepared by an already known process, namely so-called CMOS process.

The electromagnetic wave absorption/photoelectric conversion part for the G light is represented by 6, 7, 8, 9, 10 and 14. 6 and 14 indicate transparent electrodes respectively constituting a counter electrode and a pixel electrode. The pixel electrode 14 is a transparent electrode, but a connection with aluminum or molybdenum is often required for obtaining a satisfactory electrical connection with the plug 15. A bias is applied between these transparent electrodes, through wirings from a connecting electrode 18 and a counter electrode 20. There is preferred a configuration of applying a positive bias to the pixel electrode 14 with respect to the counter electrode 6, thereby accumulating electrons in the n-layer 25. A representative structure of the organic layer is illustrated by an electron blocking layer 7, a p-layer 8, an n-layer 9 and a positive hole blocking layer 10. A total thickness of the organic layer formed by the layers 7, 8, 9 and 10 is preferably 0.5 µm or less, more preferably 0.3 µm or less and particularly preferably 0.2 µm or less. Each of the transparent counter electrode 6 and the transparent pixel electrode 14 particularly preferably has a thickness of 0.2 µm or less. 3, 4 and 5 indicate protective films principally constituted of silicon nitride or the like, and such protective films facilitates preparation of the layers including the organic layer. In particular, these layers can reduce a damage to the organic layer in the preparation of a resist pattern or in an etching, at the formation of the connecting electrode 18 and the like. Also a preparation with a mask is possible in order to avoid a preparation of a resist pattern or an etching. The protective films 3 and 4 preferably has a thickness of 0.5 µm or less, as long as the aforementioned conditions are met.

A protective film 3 for the connecting electrode 18, an infrared-intercepting dielectric multi-layered film 2, and an antireflection film 1 preferably have a total thickness of 1 µm or less.

The image pickup device shown in FIG. 1 has a structure having a B pixel and an R pixel for four G pixels, but there can also be adopted a structure having a B pixel and an R pixel for a G pixel, a structure having a 5 pixel and an R pixel for three G pixels, or a structure having a B pixel and an R pixel for two G pixels. Also an arbitrary combination may be adopted. The foregoing shows preferred embodiments of the invention, but the invention is not limited to such embodiments.

(Electrode)

The electromagnetic wave absorption/photoelectric conversion part constituted of the organic -layer of the invention is sandwiched between a pair of electrodes, respectively constituting a pixel electrode and a counter electrode, preferably a lower one being the pixel electrode.

The counter electrode is preferably capable of taking out positive holes from a positive hole transporting photoelectric conversion film or a positive hole transport layer, and is formed by a metal, an alloy, a metal oxide, an electroconductive compound or a mixture thereof. The pixel electrode is preferably capable of taking out electrons from an electron transporting photoelectric conversion film or an electron transport layer, and is formed by a material selected in consideration of an adhesion to an adjacent layer such as an electron transporting photoelectric conversion film or an electron transport layer, an electron affinity, an ionization potential and a stability. Specific examples of the material include a conductive metal oxide such as tin oxide, zinc oxide, indium oxide or indium tin oxide (ITO), a metal such as gold, silver, chromium or nickel, a mixture or a laminate of such metal and a conductive metal oxide, an inorganic conductive material such as copper iodide or copper sulfide, an organic conductive material such as polyaniline, polythiophene or polypyrrole, and a silicon compound or a laminate thereof with ITO, and a conductive metal oxide is preferable and, in consideration of a productivity, a high conductivity and a transparency, ITO and IZO are particularly preferable. A film thickness can be suitable selected according to the material, but is preferably within a range of 10 nm to 1 µm, more preferably 30 to 500 nm, and further preferably 50 to 300 nm.

The pixel electrode and the counter electrode can be prepared by various methods depending on the material, and, for example, ITO film can be prepared by an electron beam method, a sputtering method, a resistance-heated evaporation method, a chemical reaction (sol-gel) method or a coating method of a dispersion of indium tin oxide. The ITO film may be subjected to a UV-ozone treatment or a plasma treatment.

In the invention, the transparent electrode film is preferably prepared in a plasma-free state. The preparation of the transparent electrode film prepared in a plasma-free state allows to reduce an influence of the plasma to the substrate, thereby improving the photoelectric conversion characteristics. The plasma-free state means a state where plasma is not generated in the course of formation of the transparent electrode film or a state where a distance from a plasma source to the substrate is 2 cm or larger, preferably 10 cm or larger and more preferably 20 cm or larger in order to reduce the plasma reaching the substrate.

An apparatus which does not generate plasma in the course of formation of the transparent electrode film can be an electron beam (EB) evaporation apparatus or a pulsed laser evaporation apparatus. As such EB evaporation apparatus or pulsed laser evaporation apparatus, there can be employed apparatuses described for example by Yutaka Sawada, "New Development of Transparent Conductive Film", CMC Co., 1999, Yutaka Sawada, "New Development of Transparent Conductive Film II", CMC Co., 2002, "Technology of Transparent Conductive Film", Nippon Gakujutsu Shinko-kai, published by ohm-sha, 1999 and references cited therein. In the following description, a process of forming a transparent electrode film with an EB evaporation apparatus will be referred as an EB evaporation process, and a process of forming a transparent electrode film with a pulsed laser evaporation apparatus will be referred to as a pulsed laser evaporation process.

An apparatus capable of realizing a state having a distance from a plasma source to the substrate is 2 cm or larger and capable of reducing the plasma reaching the substrate (hereinafter called plasma-free film forming apparatus) can be an opposed-target sputtering apparatus or an arc plasma evaporation apparatus, and there can be utilized apparatuses described for example in Yutaka Sawada, "New Development of Transparent Conductive Film", CMC Co., 1999, Yutaka Sawada, "New Development of Transparent Conductive Film II", CMC Co., 2002, "Technology of Transparent Conductive Film", Nippon Gakujutsu Shinko-kai, published by Ohm-sha, 1999 and references cited therein.

In the following a detailed explanation will be given to electrodes in the electromagnetic wave absorption/photoelectric conversion part of the invention. The photoelectric conversion film of the organic layer is sandwiched between a pixel electrode film and a counter electrode film, and may contain an interelectrode material. The pixel electrode film is an electrode film prepared on the substrate bearing the charge accumulation/transfer/readout part, and is usually divided into individual pixels, in order to read the charge, converted by the photoelectric conversion film, by the charge accumulation/transfer/readout circuit in pixel-by-pixel basis thereby obtaining an image.

The counter electrode film, sandwiching the photoelectric conversion film in cooperation with the pixel electrode film, has a function of outputting a charge of a polarity opposite to that of the signal charge. Since such charge output need not be divided between the pixels, the counter electrode film can be formed in common between the pixels. It is therefore also called a common electrode film.

The photoelectric conversion film is positioned between the pixel electrode film and the counter electrode film, and the photoelectric conversion function is realized by such photoelectric conversion film, such pixel electrode film and such counter electrode film.

An example of the laminate structure of the photoelectric conversion film with a single organic layer laminated on the substrate is a structure including, in succession from the substrate, a pixel electrode film (basically a transparent electrode film), a photoelectric conversion film, and a counter electrode film (transparent electrode film), but such structure is not restrictive.

Also in case of having two organic layers laminated on the substrate, there can be conceived a structure including, in succession from the substrate, a pixel electrode film (basically a transparent electrode film), a photoelectric conversion film, a counter electrode film (transparent electrode film), an interlayer insulation film, a pixel electrode film (basically a transparent electrode film), a photoelectric conversion film, and a counter electrode film (transparent electrode film).

The transparent electrode film constituting the photoelectric conversion part of the invention is preferably constituted of a material that can be formed into a film by an EB evaporation apparatus or a pulsed laser evaporation apparatus, such as a metal, an alloy, a metal oxide, a metal nitride, a metal boride, an organic conductive compound or a mixture thereof. Specific examples of the material include a conductive metal oxide such as tin oxide, zinc oxide, indium oxide, indium zinc oxide (IZO), indium tin oxide (ITO) or indium wolfram oxide (IWO), a metal nitride such as titanium nitride, a metal such as gold, platinum, silver, chromium, nickel or aluminum, a mixture or a laminate of such metal and a conductive metal oxide, an inorganic conductive material such as copper iodide or copper sulfide, an organic conductive material such as polyaniline, polythiophene or polypyrrole, and a laminate thereof with ITO. Also there can be employed materials described for example in Yutaka Sawada, "New Development of Transparent Conductive Film", CMC Co., 1999, Yutaka Sawada, "New Development of Transparent Conductive Film II", CMC Co., 2002, and "Technology of Transparent Conductive Film", Nippon Gakujutsu Shinko-kai, published by Ohm-sha, 1999.

A material for the transparent electrode film is particularly preferably ITO, IZO, $SnO_2$, ATO (antimony-doped tin oxide), ZnO, AZO (antimony-doped zinc oxide), GZO (gallium-doped zinc oxide), $TiO_2$ or FTO (fluorine-doped tin oxide). The transparent electrode film has an optical transmittance, at a peak wavelength of a photoelectric conversion optical absorption of a photoelectric conversion film in an image pickup device containing such transparent electrode film, preferably 60% or higher, more preferably 80% or higher, further preferably 90% or higher, and particularly preferably 95% or higher. A surface resistivity of the transparent electrode film is different in a preferable range, depending on whether the transparent electrode film is a pixel electrode or a counter electrode and whether the charge accumulation/transfer/readout part has a CCD structure or a CMOS structure. In case it is employed as a counter electrode and the charge accumulation/transfer/readout part has a CMOS structure, a surface resistivity is preferably 10,000 $\Omega$/sq. or less, more preferably 1,000 $\Omega$/sq. or less. In case it is employed as a counter electrode and the charge accumulation/transfer/readout part has a CCD structure, a surface resistivity is preferably 1,000 $\Omega$/sq. or less, more preferably 100 $\Omega$/sq. or less. In case it is employed as a pixel electrode, a surface resistivity is preferably 1,000,000 $\Omega$/sq. or less, more preferably 100,000 $\Omega$/sq. or less.

Now there will be explained conditions for forming the transparent electrode film. At the formation of the transparent electrode film, a substrate temperature is preferably 500° C. or less, more preferably 300° C. or less, and further preferably 200° C. or less and particularly preferably 150° C. or less. Also a gas may be introduced in the course of formation of the transparent electrode film, and the type of such gas is basically not restricted, and Ar, He, oxygen or nitrogen or a mixture thereof may be employed. Particularly for an oxide material, oxygen gas is advantageously employed since an oxygen deficiency may be generated.

(Inorganic Layer)

Now an inorganic layer as the electromagnetic wave absorption/photoelectric conversion part will be explained. In this case, a photoelectric conversion is executed by the inorganic layer on the light transmitted by an overlying organic layer. In the organic layer, there is generally employed a pn junction or a pin junction of crystalline silicon, amorphous silicon or a compound semiconductor such as GaAs. As a laminate structure, there can be employed a structure described in U.S. Pat. No. 5,965,875. in which laminated light-receiving portions are formed utilizing a wavelength dependence of the absorption coefficient of silicon and a color separation is achieved in the direction of depth. In this structure, since the color separation is achieved by a penetration depth of the light into silicon, each laminated light-receiving portion has a broad detecting spectral range. However, the color separation can be significantly improved by employing the aforementioned organic layer as an upper layer, thus detecting the light, transmitted by the organic layer, by the depth in the silicon. Particularly in case of employing an organic G layer, the B and R lights alone are transmitted by the organic layer and are to be separated in the direction of depth in silicon, whereby the color separation is improved. Also in case the organic layer constitutes a B or R layer, the color separation can be improved by suitable selecting the electromagnetic wave absorption/photoelectric conversion part in the direction of depth in silicon. In case of employing two organic layers, the function of the electromagnetic wave absorption/photoelectric conversion part in silicon is basically required for one color only, whereby a desirable color separation can be attained.

The inorganic layer preferably has a structure in which plural photodiodes are superposed for each pixel and in the direction of depth of the semiconductor substrate, and color signals corresponding to signal charges generated in such plural photodiodes by the lights absorbed thereon are read out to the exterior. Preferably, such plural photodiodes includes at least one of a first photodiode provided in a depth absorbing the B light and a second photodiode provided in a depth absorbing the R light, and a color signal readout circuit is provided for reading a color signal corresponding to the signal charge, generated in each of the plural photodiodes. Such structure enables a color separation without employing a color filter. Also in certain cases there can also be detected a light of a negative sensitivity component, whereby a color image pickup with satisfactory color reproducibility can be realized. In the invention, it is preferred that a junction of the first photodiode is formed at a depth of about 0.2 μm or less from the surface of the semiconductor substrate and that a junction of the second photodiode is formed at a depth of about 2 μm or less from the surface of the semiconductor substrate.

The inorganic layer will be explained in further details. The inorganic layer can preferably be constructed as a photosensor element of a photoconduction type, a PN junction type, a Schottky junction type, a PIN junction type or an MSM (metal-semiconductor-metal) type, or a photosensor element of a phototransistor type. The invention preferably employs a photosensor element formed, in a single semiconductor substrate, by alternately laminating a plurality of an area of a first conductive type and an area of a second conductive type opposite to the first conductive type and positioning junctions of the areas of the first and second conductive types at depths suitable for photoelectric conversion of mutually different plural wavelength regions. The single semiconductor substrate is preferably a single crystal silicon, and a color separation can be achieved by utilizing the absorption wavelength characteristics of the silicon substrate, varying along the direction of depth.

An inorganic semiconductor of an InGaN type, an InAlN type, an InAlF type, or an InGaAlP type can also be employed. The inorganic semiconductor of InGaN type is suitably regulated in a content of In so as to have a peak absorption within a blue wavelength region, such as a composition $In_xGA_{1-x}N$ (0<x<1). Such compound semiconductor can be prepared by a metalorganic chemical vapor deposition (MOCVD) process. A nitride semiconductor of InAlN type, utilizing Al belonging to a group 13 as Ga, can also be utilized as a photosensor of a short wavelength, as in. InGaN type. Also there can be utilized InAlP or InGaAlP which matches the lattice of the GaAs substrate.

The inorganic semiconductor may be formed in an embedded structure. The embedded structure means a structure in which both ends of a short-wavelength photosensor area are covered with a semiconductor different from that of the short-wavelength photosensor area. The semiconductor covering the both ends preferably has a band gap wavelength shorter than or comparable to that of the short-wavelength photosensor area.

The organic layer and the inorganic layer may be combined in any form. Between the organic layer and the inorganic layer, an insulation layer is preferably provided for electrical insulation.

The junction preferably has a structure of npn or pnpn from the light entrance side. A pnpn junction is more preferable, since a higher surface potential attained by a surficial p-layer allows to trap positive holes generated in the vicinity of the surface and a dark current, thereby decreasing the dark current.

Such photodiode can be prepared by four pnpn layers constituting pn junction diodes, by forming an n-layer, a p-layer, an n-layer and a p-layer in succession in the direction of depth by successive diffusions from the surface of the p-type silicon substrate. An incident light into the diode from the surface side penetrates deeper with a longer wavelength, and, since the incident wavelength and the attenuation coefficient are specific to silicon, the pn junction plane is so designed as to cover each wavelength region of the visible light. An npn 3-layered junction diodes can be obtained by forming an n-layer, a p-layer and an n-layer in this order. The n-layer is used for taking out an optical signal, and the p-layer is grounded.

Also by forming a lead electrode to each area and applying a predetermined potential thereto, each area is depleted and a capacitance of each junction is made infinitely small. In this manner, the capacitance generated at the junction can be made extremely small.

(Auxiliary Layer)

In the invention, an ultraviolet absorbing layer and/or an infrared absorbing layer is preferably provided as an uppermost layer of the electromagnetic wave absorption/photoelectric conversion part. The ultraviolet absorbing layer absorbs or reflects at least a light of 400 nm and shorter, and preferably has a reflectance of 50% or higher in a wavelength region of 400 nm and shorter. The infrared absorbing layer absorbs or reflects at least a light of 700 nm and longer, and preferably has a reflectance of 50% or higher in a wavelength region of 700 nm and longer.

Such ultraviolet absorbing layer or the infrared absorbing layer can be formed by a known method. There is known, for example, a method of forming a mordant layer constituted of a hydrophilic polymer such as gelatin, casein, glue or polyvinyl alcohol, and adding or dyeing such mordant layer with a dye having a desired absorption wavelength. Also there is known a method of employing a colored resin in which a certain colorant is dispersed in a transparent resin. For example, a colored resin film formed by mixing a colorant in a polyamino resin can be utilized as described in JP-A Nos. 58-46325, 60-78401, 60-184202, 60-184203, 60-184204 and 60-184205. Also a colored material utilizing a photosensitive polyimide resin is usable.

It is also possible to disperse a colorant in an aromatic polyamide resin having a photosensitive group within the molecule and capable of providing a cured film at 200° C. or lower as described in JP-B No. 7-113685, or to utilize a colored resin in which a pigment described in JP-B No. 7-69486 is dispersed.

In the invention, a multi-layered dielectric film is employed preferably. The multi-layered dielectric film has a sharp wavelength dependent of the light transmission, and can be employed advantageously.

Each electromagnetic wave absorption/photoelectric conversion part is preferably separated by an insulation layer. The insulation layer can be formed with a transparent insulating material, such as glass, polyethylene, polyethylene terephthalate, polyethersulfon, or polypropylene. Also silicon nitride, silicon oxide or the like can be employed advantageously. In the invention, silicon nitride formed by a plasma CVD process is employed preferably as it has a high density and a high transparency.

A protective layer or a sealing layer may also be provided for the purpose of avoiding a contact with oxygen or moisture. The protective layer can be formed for example by an inorganic film such as of a thin diamond film, a metal oxide or a metal nitride, a polymer film such as of a fluorinated resin, polyparaxylene, polyethylene, a silicone resin or a polystyrene resin, or a photocurable resin. It is also possible to cover the device portion with a glass, a gas-impermeable plastic material or a metal and to package the device with a suitable sealing resin. In such case, a highly moisture-absorbing material may be made present in the package.

It is also preferable to form a microlens array on the photosensitive device thereby improving a light condensing efficiency.

(Charge Accumulation/Transfer/Readout Part)

As to the charge accumulation/transfer/readout part, reference can be made for example to JP-A Nos. 58-103166, 58-103165 and 2003-332551. There can be suitably employed a structure bearing a MOS transistor on a semiconductor substrate for each pixel unit, or a structure having a CCD as the device. For example in an image pickup device utilizing MOS transistors, an incident light transmitted by the electrode generates a charge in the photoelectric conversion film, and such charge travels in the photoelectric conversion film to an electrode by an electric field, generated between the electrodes by an voltage application of the electrodes, further travels to a charge accumulating part of the MOS transistor and is accumulated therein. The charge accumulated in the charge accumulating part moves to a charge readout part by a switching operation of the MOS transistor, and is outputted as an electrical signal. In this manner full-color image signals are supplied to a solid-state image pickup apparatus including a signal processing part.

It is also possible to inject a bias charge of a predetermined amount into an accumulating diode (refreshing mode), and, after an accumulation of a predetermined charge (photoelectric conversion mode), to read out a signal charge. The photosensor device itself may be utilized as an accumulating diode, or an accumulating diode may be separately provided.

A signal readout will be explained in further details. The signal readout can be executed by an ordinary color signal readout circuit. A signal charge or a signal current generated by photoelectric conversion in the photosensor element is accumulated in the photosensor element itself or a capacitor attached thereto. The accumulated charge is read out by a selection of a pixel position, by a method of a MOS image pickup device (so-called MOS sensor) utilizing an X-Y addressing. Another address selecting method can be a method of selecting pixel by pixel by a multiplexer switch and a digital shift register thereby reading out the signal voltage (or charge) to a common output line. An image pickup device of a two-dimensional array structure with an X-Y address method is known as a CMOS sensor. In such device, a switch provided in a pixel position in an X-Y crossing point is connected to a vertical scanning shift register, and, when the switch is turned by a voltage from the vertical scanning shift register, signals read from pixels provided on a same row are read to an output line in a column direction. Such signals are read out from an output end in succession through switches driven by a horizontal scanning shift register.

The readout of the output signal can be executed by a floating diffusion detector or a floating gate detector. Also an S/N ratio can be improved by a signal amplifier provided in the pixel portion or by a correlated double sampling method.

A signal processing includes a gamma correction by an ADC circuit, a digitization by an A/D converter, a luminance signal processing and a color signal processing. The color signal processing can be a white balancing, a color separation, and a color matrix process. In case of an application to an NTSC signal, there can be utilized a conversion process from RGB signals to YIQ signals.

The charge transfer/readout part is required to have a charge mobility of 100 cm$^2$/volt·sec or higher, and such mobility can be obtained by selecting a material from a semiconductor of group IV, III-V or II-VI. Among these, a silicon semiconductor (also represented as Si semiconductor) is preferred because of an advanced microstructuring technology and a low cost. The charge transfer/readout is proposed in various methods, any of which may be adopted. A particularly preferred method is that employed in a CMOS type device or a CCD type device. In the invention, the CMOS type is often more preferable in consideration of a high-speed readout, a pixel addition, a partial signal reading and an electric power consumption.

(Connection)

Plural connecting portions for connecting the electromagnetic wave absorption/photoelectric conversion part and the charge transfer/readout part may be connected with any metal, but such metal is preferably selected from copper, aluminum, silver, gold, chromium and tungsten, and is particularly preferable copper. Corresponding to plural electromagnetic wave absorption/photoelectric conversion parts, respective contact portions have to be positioned between such part and the charge transfer/readout part. In case of a laminated structure of the plural photosensitive units for blue, green and red lights, connections have to be made between the output electrode for the blue light and the charge transfer/readout part, between the output electrode for the green light and the charge transfer/readout part, and between the output electrode for the red light and the charge transfer/readout part.

(Process)

The laminated image pickup device of the invention can be prepared by so-called microfacbrication process employ for producing known integrated circuits. This process is basically constituted of repeated cycles of a pattern exposure by an actinic light or an electron beam (such as i- or g-line of a mercury lamp, an excimer laser beam, an X-ray or an electron beam), a patterning by a development and/or baking, a positioning of a device forming material (for example by coating, evaporation, sputtering or CV), and an elimination of the material from a non-pattern portion (for example by heat treatment or dissolving).

(Application)

A chip size of the device can be selected as a Brownie size, an 135 size, an APS size, a $^1$/$_{1.8}$-inch size or a smaller size. In the invention, a pixel size of the laminated image pickup device is represented by a circle-corresponding diameter corresponding to a largest area of plural electromagnetic wave absorption/photoelectric conversion parts. The pixel size may be selected arbitrarily, but is preferably 2-20 µm, more preferably 2-10 µm and particularly preferably 3-8 µm.

A pixel size exceeding 20 µm deteriorates the resolution, while a pixel size smaller than 2 µm also deteriorates the resolution because of an interference between the pixels.

The image pickup device of the invention can be utilized in a digital still camera, and is also advantageously applicable to a TV camera. Other applications include a digital video camera, a monitor camera (for an office building, a car park, a bank/unmanned finance counter, a shopping center, a convenience store, an outlet mall, a department store, a pinball game shop, a karaoke parlor, a game arcade, a hospital etc.), other sensors (a television door phone, a personal identification sensor, a factory automation sensor, a home-use robot, an industrial robot, a piping inspection system etc.), a medical sensor (an endoscope or a retinoscope), a television conference system, a television telephone, a mobile phone with a camera, an automobile safety system (a rear view monitor, a collision forecast system or a lane maintenance system), a television game sensor and the like.

Among these, the image pickup device of the invention is suitable for a television camera, because, not requiring a color separation optical system, it can achieve a smaller size and a lower weight of the television camera. Also because of a high sensitivity and a high resolution, it is particularly suitable for a television camera for high-vision broadcasting. The television camera for high-vision broadcasting includes a camera for a digital high-vision broadcasting.

The image pickup device of the invention, capable of dispensing an optical low-pass filter, can be anticipated for a higher sensitivity and a higher resolution.

Also since the image pickup device of the invention can be made thinner in thickness and can dispense with the color separation optical system, a single camera can be adapted to various photographing scenes requiring different sensitivities such as "environments of different brightnesses such as daytime and night" or "a still object and a moving object", or scenes of different requirements for a spectral sensitivity and a color reproducibility, by replacing the image pickup device of the invention, and the burden to the photographer can be alleviated because plural cameras need not be carried. The image pickup device to be replaced can be, for example, those for an infrared photographing, for a monochromatic photographing, and for a change of a dynamic range.

A TV camera of the invention can be prepared, by referring to a description in Image Information Media Association, "Design Technology of Television Camera" (published by Corona Co., Aug. 20, 1999, ISBN 4-339-00714-5), Chapter 2, and replacing the color separation optical system and the image pickup device in the basic structure of the television camera shown in FIG. 2.1 with the image pickup device of the invention.

The above-described laminated photosensor device is usable, not only in an array as an image pickup device but also singly as a photosensor or a color photosensor such as a bio sensor or a chemical sensor.

EXAMPLES

In the following, the present example will be clarified further by examples thereof, but the present invention is not limited to such examples.

Example 1

A washed ITO substrate was placed in an evaporation apparatus, and subjected to an evaporation of a quinacridone compound (S-9) of the invention with a thickness of 100 nm, and an evaporation thereon of Alq (aluminum quinoline) with a thickness of 50 nm to obtain an organic p-n laminated photoelectric conversion layer. Then a patterned mask (with an aperture of 2×2 mm) was placed on the organic film, and aluminum was evaporated with a thickness of 500 nm in the evaporation apparatus, then the device was sealed with a desiccant to obtain a photoelectric conversion device (device No. 101).

Also a device was prepared by replacing (S-9) with (S-8) (device No. 102).

Example 2

After (S-9) was evaporated with a thickness of 100 nm as explained above, BAlq was evaporated with a thickness of 50 nm, then an electron transport material (E-1) was evaporated with a thickness of 70 nm, an aluminum electrode was evaporated as described above and the device was sealed to obtain a photoelectric conversion device (device No. 103).

Example 3

After (S-9) was evaporated with a thickness of 100 nm as in Example 2, an electron transport material 24 was evaporated with a thickness of 100 nm, then an aluminum electrode was evaporated as described above and the device was sealed to obtain a photoelectric conversion device (device No. 104).

Similar devices were prepared by replacing (S-9) of the device No. 103 with (S-3), (S-6), (S-25), (S-8) and (S-10) (device Nos. 105, 106, 107, 108 and 109).

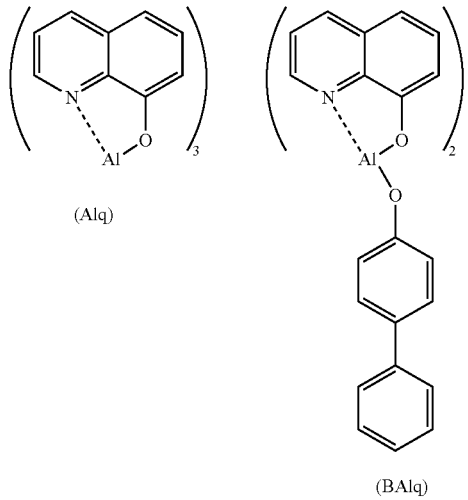

The devices were evaluated in the following manner.

A bias of 10 V was applied between the ITO at a minus side and the aluminum electrode at a plus side.

A wavelength dependence of an external quantum efficiency (IPCE) was evaluated by a solar cell evaluation apparatus, manufactured by Optel Inc. An obtained photoelectric conversion spectrum was used for a simulation to evaluate the spectral characteristics in a BGR device, and a level of the color reproducibility (spectral characteristics) was evaluated in grades A, B and C. Also a durability was evaluated, by a solar simulator, under a 24-hour continuous irradiation of a light of AM 01.5G, 100 mW/m$^2$, and a level of loss in the external quantum efficiency was evaluated in grades A, B and C. Obtained results are shown in Table 1.

TABLE 1

| device No. | p-type compound | n-type compound | electron transport compound with a longer wavelength end of 400 nm or less | external quantum effic-iency | spectral characterristics | durability |
|---|---|---|---|---|---|---|
| 101 | S-9 | Alq | none | 15% | B | A |
| 102 | S-8 | Alq | none | 16% | B | A |
| 103 | S-9 | BAlq | 24 | 18% | A–B | A |
| 104 | S-9 | none | 24 | 16% | A | A |

TABLE 1-continued

| device No. | p-type compound | n-type compound | electron transport compound with a longer wavelength end of 400 nm or less | external quantum effici-ency | spectral characterristics | durability |
|---|---|---|---|---|---|---|
| 105 | S-3 | none | 24 | 12% | A | A |
| 106 | S-6 | none | 24 | 10% | A | A |
| 107 | S-25 | none | 24 | 14% | A | A |
| 108 | S-8 | none | 24 | 19% | A | A |
| 109 | S-10 | none | 24 | 18% | A | A |

The devices of the present examples have a spectral sensitivity in the green color region, and are of an evidently higher efficiency in comparison with a device with a rhodamine 6G/polysilane photoelectric conversion film having a photosensitivity in the green color region (efficiency 1%), described in JP-A No. 2003-234460. Also a device utilizing an electron transport material 24 having a longer wavelength end of absorption of 400 nm or less did not have a sensitivity around 400 nm, and showed excellent spectral characteristics. Also the devices of the examples showed a satisfactory durability.

Example 4

A washed ITO substrate was placed in an evaporation apparatus, and subjected to an evaporation of a quinacridone compound (S-8) of the invention with a thickness of 100 nm, then an aluminum electrode was evaporated as described above and the device was sealed to obtain a photoelectric conversion device (device No. 201). Also an ITO substrate was subjected to an evaporation of an n-type photoelectric conversion material Me-PTC with a thickness of 50 nm, an evaporation of (S-8) with a thickness of 50 nm and an evaporation thereon of an aluminum electrode and the device was sealed to obtain a photoelectric conversion device (device No. 202). A bias of 10 V was applied between the ITO at a plus side and the aluminum electrode at a minus side, and a current was measured under a light irradiation and without a light irradiation in a shield box, to determine an S/N ratio. The device No. 202 showed an S/N ratio of 40 dB while the device No. 201 showed an SIN ratio less than 20 dB, indicating that the crystalline n-type photoelectric conversion material provides a higher S/N ratio.

A 3-layered laminate image pickup device as shown in FIG. 1 can be prepared by similarly preparing a device having a spectral sensitivity in the green color region and combining it with a device for red color and a device for blue color.

Also an organic-inorganic mixed device as shown in FIG. 2 can be obtained by similarly preparing a device having a spectral sensitivity in the green color region utilizing the compound of the invention, and combining it with a red-sensitive inorganic layer and a blue-sensitive inorganic layer.

The photoelectric conversion film, the photoelectric conversion device and the image pickup device of the present invention show a narrow half-peak width of the absorption thereby providing an excellent color reproducibility, also a high photoelectric conversion efficiency and an excellent durability, and also provides following effects in a BGR 3-layer laminated solid-state image pickup device.

A three-layered structure eliminates generation of moire fringes, and the absence of an optical low-pass filter provides a high resolution and prevents color blotting. Also it is characterized in a simple signal process, without generation of pseudo signals. Further, in case of a CMOS structure, a pixel mixing and a partial image reading can be easily achieved.

Also it has an aperture rate of 100% and does not require microlenses, there are no restriction on an exit pupil distance to an image pickup lens and no shading phenomenon. Therefore the device is suitable for a lens-exchangeable camera, in which the lens can be made thin.

Also absence of the microlenses enables a sealing with glass by filling an adhesive material, thereby realizing a thinner package, an increased production yield and a reduced cost.

Also the use of an organic dye achieves a high sensitivity, can also dispense with an IR filter and reduces a flare.

The entire disclosure of each and every foreign patent application from which the benefit of foreign priority has been claimed in the present application is incorporated herein by reference, as if fully set forth.

What is claimed is:

1. An image pickup device comprising an organic photoelectric conversion film sandwiched between at least two electrodes,
wherein the organic photoelectric conversion film is a layer consisting essentially of a quinacridone derivative represented by a general formula (I) or a quinazoline derivative represented by a general formula (II):

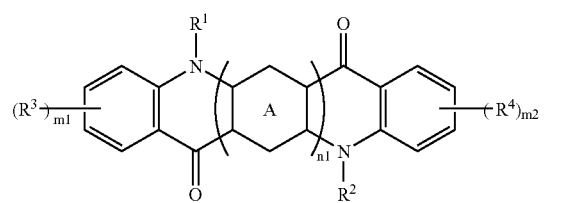

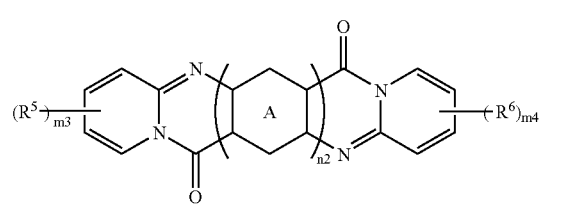

wherein the ring A represents:

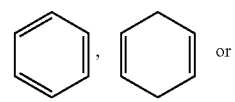

-continued

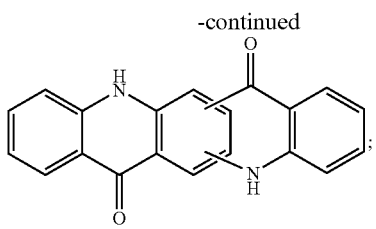

n1 and n2 each independently represents 0 or 1; a portion of the ring A having n1 or n2 of 0 represents:

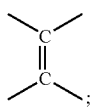

wherein the ring A may further have a substituent;

$R^1$ and $R^2$ each independently represents a hydrogen atom, an alkyl group, an aryl group or a heterocyclic group;

$R^3$, $R^4$, $R^5$ and $R^6$ each independently represents an alkyl group having 1 to 30 carbon atoms, an alkenyl group having from 2 to 30 carbon atoms, an alkynyl group having from 2 to 30 carbon atoms, an aryl group having from 6 to 30 carbon atoms, an amino group having from 0 to 30 carbon atoms, an alkoxy group having from 1 to 30 carbon atoms, an aryloxy group having from 6 to 30 carbon atoms, a heteroaryloxy group having from 1 to 30 carbon atoms, an acyl group having from 1 to 30 carbon atom, an alkoxycarbonyl group having from 2 to 30 carbon atoms, an aryloxycarbonyl group having from 7 to 30 carbon atoms, an acyloxy group having from 2 to 30 carbon atoms, an acylamino group having from 2 to 30 carbon atoms, an alkoxycarbonylamino group having from 2 to 30 carbon atoms, an aryloxycarbonylamino group having from 7 to 30 carbon atoms, a sulfonylamino group having from 1 to 30 carbon atoms, a sulfamoyl group having from 0 to 30 carbon atoms, a carbamoyl group having from 1 to 30 carbon atoms, an alkylthio group having from 1 to 30 carbon atoms, an arylthio group having from 6 to 30 carbon atoms, a heterocycle-substituted thio group having from 1 to 30 carbon atoms, a sulfonyl group having from 1 to 30 carbon atoms, a sulfinyl group having from 1 to 30 carbon atoms, an ureido group having from 1 to 30 carbon atoms, a phosphoric acid amide group having from 1 to 30 carbon atoms, a hydroxyl group, a mercapto group, a halogen atom, a cyano group, a sulfo group, a carboxyl group, a nitro group, a hydroxamic acid group, a sulfino group, a hydrazino group, an imino group, a heterocyclic group having from 1 to 30 carbon atoms, or a silyl group having from 3 to 40 carbon atoms; and m1, m2, m3 and m4 each independently represents an integer of 0 to 4, and, in case m1, m2, m3 or m4 represents an integer of 2 to 4, plural $R^3$s, $R^4$s, $R^5$s or $R^6$s may be mutually bonded to form a ring; and wherein the layer has a thickness of from 30 nm to 300 nm.

2. An image pickup device according to claim 1, wherein, in an absorption spectrum of the organic photoelectric conversion film, an absorption peak at a longest wavelength has a half-peak width of 50 to 150 nm.

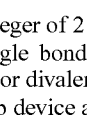

11. A device comprising at least two electromagnetic wave-absorbing/photoelectric converting portions, of which at least one comprises an image pickup device according to claim 1.

12. A device according to claim 11, wherein said at least two electromagnetic wave-absorbing/photoelectric converting portions have a laminate structure of at least two layers.

13. A device according to claim 12, wherein an upper layer of said at least two layers comprises a portion capable of a photoelectric conversion by absorbing green light.

14. A device comprising at least three electromagnetic wave-absorbing/photoelectric converting portions, of which at least one comprises an image pickup device according to claim 1.

15. A device according to claim 14, wherein said at least three electromagnetic wave-absorbing/photoelectric converting portions have a laminate structure of at least three layers, and an upper layer of said at least three layers comprises a portion capable of a photoelectric conversion by absorbing green light.

16. A device according to claim 15, wherein at least two of said at least three electromagnetic wave-absorbing/photoelectric converting portions are formed in a silicon substrate.

17. A device according to claim 14, wherein at least two of said at least three electromagnetic wave-absorbing/photoelectric converting portions are formed by inorganic layers.

18. An image pickup device comprising:
a positive hole transport material that is a layer consisting essentially of a quinacridone derivative by a general formula (I) or a quinazoline derivative by a general formula (II); and
an electron transport material having a peak wavelength of an absorption spectrum, equal to or shorter than a peak wavelength of an absorption spectrum of the positive hole transport material:

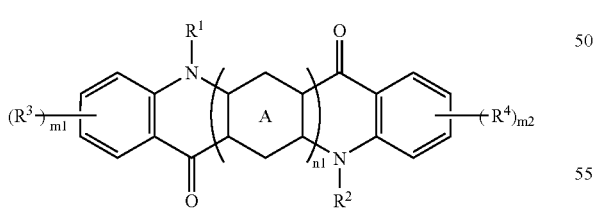

(I)

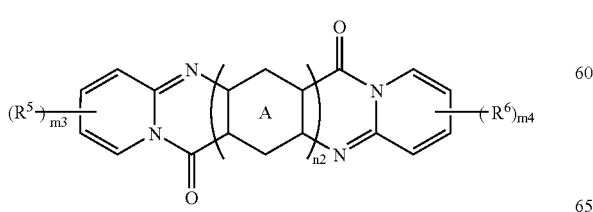

(II)

wherein the ring A represents:

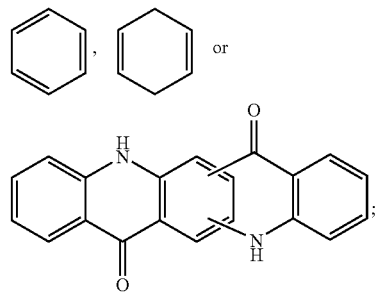

n1 and n2 each independently represents 0 or 1; a portion of the ring A having n1 or n2 of 0 represents:

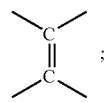

wherein the ring A may further have a substituent;

$R^1$ and $R^2$ each independently represents a hydrogen atom, an alkyl group, an aryl group or a heterocyclic group;

$R^3$, $R^4$, $R^5$ and $R^6$ each independently represents an alkyl group having 1 to 30 carbon atoms, an alkenyl group having from 2 to 30 carbon atoms, an alkynyl group having from 2 to 30 carbon atoms, an aryl group having from 6 to 30 carbon atoms, an amino group having from 0 to 30 carbon atoms, an alkoxy group having from 1 to 30 carbon atoms, an aryloxy group having from 6 to 30 carbon atoms, a heteroaryloxy group having from 1 to 30 carbon atoms, an acyl group having from 1 to 30 carbon atom, an alkoxycarbonyl group having from 2 to 30 carbon atoms, an aryloxycarbonyl group having from 7 to 30 carbon atoms, an acyloxy group having from 2 to 30 carbon atoms, an acylamino group having from 2 to 30 carbon atoms, an alkoxycarbonylamino group having from 2 to 30 carbon atoms, an aryloxycarbonylamino group having from 7 to 30 carbon atoms, a sulfonylamino group having from 1 to 30 carbon atoms, a sulfamoyl group having from 0 to 30 carbon atoms, a carbamoyl group having from 1 to 30 carbon atoms, an alkylthio group having from 1 to 30 carbon atoms, an arylthio group having from 6 to 30 carbon atoms, a heterocycle-substituted thio group having from 1 to 30 carbon atoms, a sulfonyl group having from 1 to 30 carbon atoms, a sulfinyl group having from 1 to 30 carbon atoms, an ureido group having from 1 to 30 carbon atoms, a phosphoric acid amide group having from 1 to 30 carbon atoms, a hydroxyl group, a mercapto group, a halogen atom, a cyano group, a sulfo group, a carboxyl group, a nitro group, a hydroxamic acid group, a sulfino group, a hydrazino group, an imino group, a heterocyclic group having from 1 to 30 carbon atoms, or a silyl group having from 3 to 40 carbon atoms; and m1, m2, m3 and m4 each independently represents an integer of 0 to 4, and, in case m1, m2, m3 or m4 represents an integer of 2 to 4, plural $R^3$s, $R^4$s, $R^5$s or $R^6$s may be mutually bonded to form a ring; and wherein the layer has a thickness of from 30 nm to 300 nm.

19. An image pickup device according to claim 18, wherein the electron transport material is selected from: a 5- to 7-membered heterocyclic compound comprising a nitrogen atom, an oxygen atom or a sulfur atom, said 5- to 7-membered heterocyclic compound being optionally further condensed with another ring; an aromatic condensed carbon ring compound; and a metal complex compound having a nitrogen-containing heterocyclic compound as a ligand.

20. An image pickup device according to claim 18, wherein a film of the electron transport material has a crystalline state.

* * * * *